US006815777B2

(12) United States Patent
Karasawa et al.

(10) Patent No.: US 6,815,777 B2
(45) Date of Patent: Nov. 9, 2004

(54) SEMICONDUCTOR DEVICE, MEMORY SYSTEM AND ELECTRONIC APPARATUS

(75) Inventors: Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 71 days.

(21) Appl. No.: 10/092,393

(22) Filed: Mar. 5, 2002

(65) Prior Publication Data

US 2002/0135021 A1 Sep. 26, 2002

(30) Foreign Application Priority Data

Mar. 26, 2001 (JP) ......................................... 2001-088309
Oct. 30, 2001 (JP) ......................................... 2001-333097

(51) Int. Cl.[7] .............................................. H01L 29/76
(52) U.S. Cl. ........................ 257/369; 257/371; 257/379; 257/393; 257/380; 257/394; 257/372; 257/373
(58) Field of Search ........................... 257/371, 69, 67, 257/64, 369, 383, 393, 377, 351, 385, 390

(56) References Cited

U.S. PATENT DOCUMENTS

| 5,394,358 A | * | 2/1995 | Huang ......................... 365/182 |
| 5,486,717 A | * | 1/1996 | Kokubo et al. .............. 257/385 |
| 5,734,187 A | * | 3/1998 | Bohr et al. .................. 257/377 |
| 5,831,285 A | * | 11/1998 | Takeuchi et al. ............... 257/69 |
| 6,147,385 A | * | 11/2000 | Kim et al. ................... 257/369 |
| 6,479,860 B2 | * | 11/2002 | Ohbayashi ................... 257/315 |
| 6,479,905 B1 | * | 11/2002 | Song ........................... 257/903 |
| 2002/0135003 A1 | | 9/2002 | Karasawa |
| 2002/0135027 A1 | | 9/2002 | Karasawa |

FOREIGN PATENT DOCUMENTS

| JP | 03-040449 | 2/1991 |
| JP | 07-231044 | 8/1995 |
| JP | 09-260510 | 10/1997 |
| JP | 10-163344 | 6/1998 |
| JP | 10-294387 | 11/1998 |
| JP | 11-017028 | 1/1999 |
| JP | 2000-036542 | 2/2000 |
| JP | 2000-208643 | 7/2000 |
| JP | 2000-269319 | 9/2000 |

* cited by examiner

Primary Examiner—Nathan J. Flynn
Assistant Examiner—Fazli Erdem
(74) Attorney, Agent, or Firm—Hogan & Hartson, LLP

(57) ABSTRACT

A semiconductor device is provided with a memory cell. The semiconductor device includes a first gate-gate electrode layer, a second gate-gate electrode layer, a first drain-drain wiring layer, a second drain-drain wiring layer, a first drain-gate wiring layer and a second drain-gate wiring layer. The first drain-gate wiring layer and an upper layer and a lower layer of the second drain-gate wiring layer are located in different layers, respectively.

24 Claims, 22 Drawing Sheets

First conductive layer / Third conductive layer

US 6,815,777 B2

SEMICONDUCTOR DEVICE, MEMORY SYSTEM AND ELECTRONIC APPARATUS

Japanese Patent Application No.2001-88309, filed on Mar. 26, 2001, and Japanese Patent Application No.2001-333097, filed on Oct. 30, 2001 are hereby incorporated by reference in their entirety.

BACKGROUND OF THE INVENTION

The present invention relates to semiconductor devices, such as, for example, static random access memories (SRAMs), and memory systems and electronic apparatuses provided with the same.

SRAMS, one type of semiconductor memory devices, do not require a refreshing operation and therefore have a property that can simplify the system and lower power consumption. For this reason, the SRAMs are prevailingly used as memories for electronic equipment, such as, for example, mobile phones.

BRIEF SUMMARY OF THE INVENTION

The present invention provides a semiconductor device that can reduce its cell area.

The present invention also provides a memory system and an electronic apparatus that includes a semiconductor device in accordance with the present invention.

1. Semiconductor Device

According to one aspect of the present invention, there is provided a semiconductor device including a first conduction type well region and a second conduction type well region.

The semiconductor device also includes a first gate-gate electrode layer including a gate electrode of a first load transistor and a gate electrode of the first driver transistor and a second gate-gate electrode layer including a gate electrode of a second load transistor and a gate electrode of the second driver transistor. The semiconductor device further includes a first drain-drain wiring layer that forms a part of a connection layer that electrically connects a drain region of the first load transistor and a drain region of a first driver transistor and a second drain-drain wiring layer that forms a part of a connection layer that electrically connects a drain region of the second load transistor and a drain region of a second driver transistor. The semiconductor device also includes a first drain-gate wiring layer that forms a part of a connection layer that electrically connects the first gate-gate electrode layer and the second drain-drain wiring layer and a second drain-gate wiring layer that forms a part of a connection layer that electrically connects the second gate-gate electrode layer and the first drain-drain wiring layer.

The first load transistor and the second load transistor are provided in the first conduction type well region and first driver transistor and the second driver transistor are provided in the second conduction type well region. The second drain-gate wiring layer is located in a layer over the first drain-gate wiring layer, and has an upper layer of the second drain-gate wiring layer and a lower layer of the second drain-gate wiring layer. The upper layer is located in a layer over the lower layer and the upper layer is provided above one of the first conduction type well region and the second conduction type well region.

DETAILED DESCRIPTION OF THE EMBODIMENT

Figure 1:
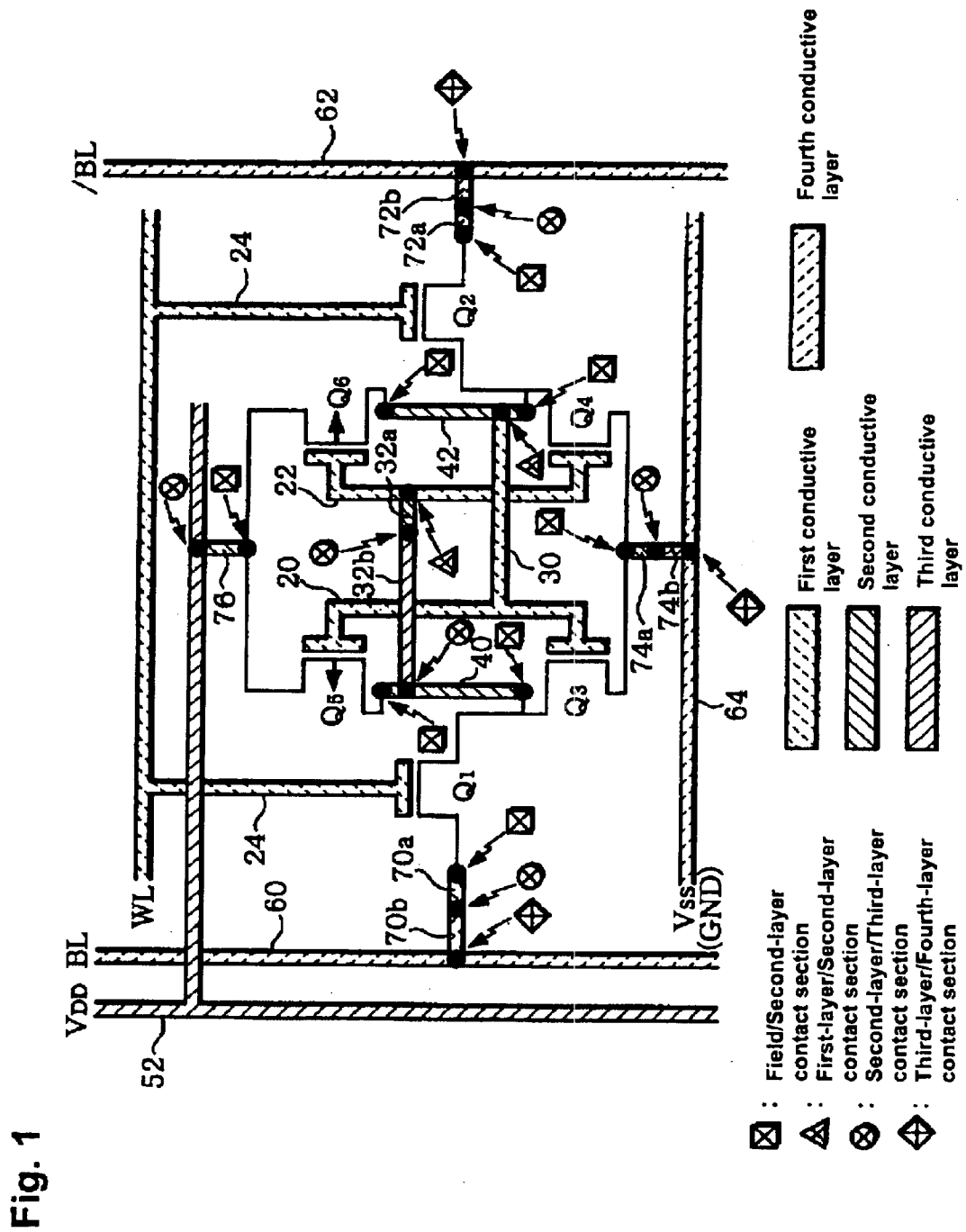
FIG. 1 shows a relationship between an equivalent circuit of an SRAM in accordance with the present embodiment and corresponding conductive layers.

An embodiment of the present invention is described. The present embodiment is the one in which a semiconductor device in accordance with the present invention is applied to in an SRAM.

According to one aspect of the present invention, there is provided a semiconductor device including a first conduction type well region and a second conduction type well region.

The semiconductor device also includes a first gate-gate electrode layer including a gate electrode of a first load transistor and a gate electrode of the first driver transistor and a second gate-gate electrode layer including a gate electrode of a second load transistor and a gate electrode of the second driver transistor. The semiconductor device further includes a first drain-drain wiring layer that forms a part of a connection layer that electrically connects a drain region of the first load transistor and a drain region of a first driver transistor and a second drain-drain wiring layer that forms a part of a connection layer that electrically connects a drain region of the second load transistor and a drain region of a second driver transistor. The semiconductor device also includes a first drain-gate wiring layer that forms a part of a connection layer that electrically connects the first gate-gate electrode layer and the second drain-drain wiring layer and a second drain-gate wiring layer that forms a part of a connection layer that electrically connects the second gate-gate electrode layer and the first drain-drain wiring layer.

The first load transistor and the second load transistor are provided in the first conduction type well region and first driver transistor and the second driver transistor are provided in the second conduction type well region. The second drain-gate wiring layer is located in a layer over the first drain-gate wiring layer, and has an upper layer of the second drain-gate wiring layer and a lower layer of the second drain-gate wiring layer. The upper layer is located in a layer over the lower layer and the upper layer is provided above one of the first conduction type well region and the second conduction type well region.

Here, the "wiring layer" means a conductive layer disposed on a field or an interlayer dielectric layer.

In accordance with the present invention, the second drain-gate wiring layer is located in a layer over the first drain-gate wiring layer. In other words, the first drain-gate wiring layer and the second drain-gate wiring layer are located in different layers, respectively. As a result, the pattern density of each wiring layer in each of the layers where the first drain-gate wiring layer and the second drain-gate wiring layer are formed, respectively, can be reduced and the cell area can be made smaller, compared to the case where the first drain-gate wiring layer and the second drain-gate wiring layer are formed in the same layer.

In this aspect, as described below, when the upper layer is provided above the second conduction type well region, a main word line can be readily provided above the first conduction type well region. Also, when the upper layer is provided above the first conduction type well region, a main word line can be readily provided above the second conduction type well region.

Accordingly, the semiconductor device of this aspect may have one of the following arrangements:

(1) The upper layer may be provided above the second conduction type well region without exceeding a border between the first conduction type well region and the second conduction type well region.

With this arrangement, the main word line may be provided in the same layer as the upper layer, and may be provided above the first conduction type well region without exceeding a border between the first conduction type well region and the second conduction type well region.

(2) The upper layer may be provided above the first conduction type well region without exceeding a border between the first conduction type well region and the second conduction type well region.

With this arrangement, the main word line may be provided in the same layer as the upper layer, and may be provided above the second conduction type well region without exceeding a border between the first conduction type well region and the second conduction type well region.

Further, the semiconductor device in accordance with this aspect may include one of the following arrangements:

(3) The first drain-gate wiring layer may be electrically connected to the second drain-drain wiring layer through a contact section, the lower layer may be electrically connected to the second gate-gate electrode layer through a contact section, and the upper layer may be electrically connected to the first drain-drain wiring layer and the lower layer through contact sections, respectively.

(4) The first gate-gate electrode layer, the second gate-gate electrode layer and the first drain-gate wiring layer may be provided in the same layer, and the first drain-gate wiring layer may be provided over a border between the first conduction type well region and the second conduction type well region.

(5) The first drain-gate wiring layer and the upper layer may be provided in a manner not to overlap one another as viewed from a vertical direction.

(6) The first gate-gate electrode layer, the second gate-gate electrode layer and the first drain-gate wiring layer may be located in a first conductive layer, the first drain-drain wiring layer, the second drain-drain wiring layer and the lower layer may be located in a second conductive layer, and the upper layer may be located in a third conductive layer.

(7) A second conductive layer may be a nitride layer of a refractory metal (for example, titanium nitride). As a result of the second conductive layer being a nitride layer of a refractory metal, the thickness of the second conductive layer can be reduced, and miniature processing can be readily performed. Accordingly, the cell area can be reduced.

(8) A second conductive layer may have a thickness of 100 to 200 nm.

2. Memory System

A memory system in accordance with another aspect of the present invention is provided with the above described semiconductor device.

3. Electronic Apparatus

An electronic apparatus in accordance with further aspect of the present invention is provided with the above described semiconductor device.

1. Equivalent Circuit of SRAM

FIG. 1 shows a relationship between an equivalent circuit of an SRAM in accordance with the present embodiment and corresponding conductive layers. The SRAM of the present embodiment is a type in which one memory cell is formed with six MOS field effect transistors. In other words, one CMOS inverter is formed with an n-channel type driver transistor Q3 and a p-channel type load transistor Q5. Also, one CMOS inverter is formed with an n-channel type driver transistor Q4 and a p-channel type load transistor Q6. These two CMOS inverters are cross-coupled to form a flip-flop. Further, one memory cell its formed from this flip-flop and n-channel type transfer transistors Q1 and Q2.

2. Structure of SRAM

A structure of the SRAM is described below. First, each figure is briefly described.

Figure 2:
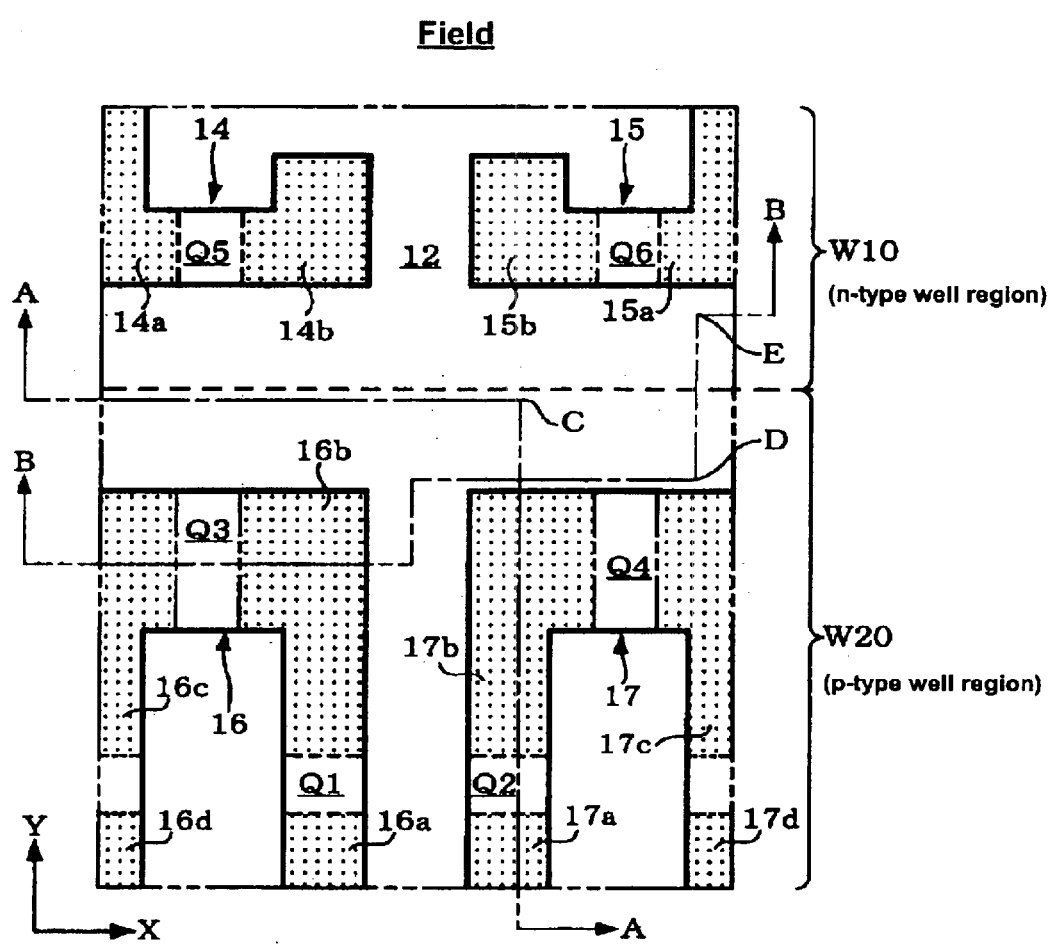
FIG. 2 schematically shows a plan view of a field of the memory cell of the SRAM in accordance with the present embodiment.
Figure 3:
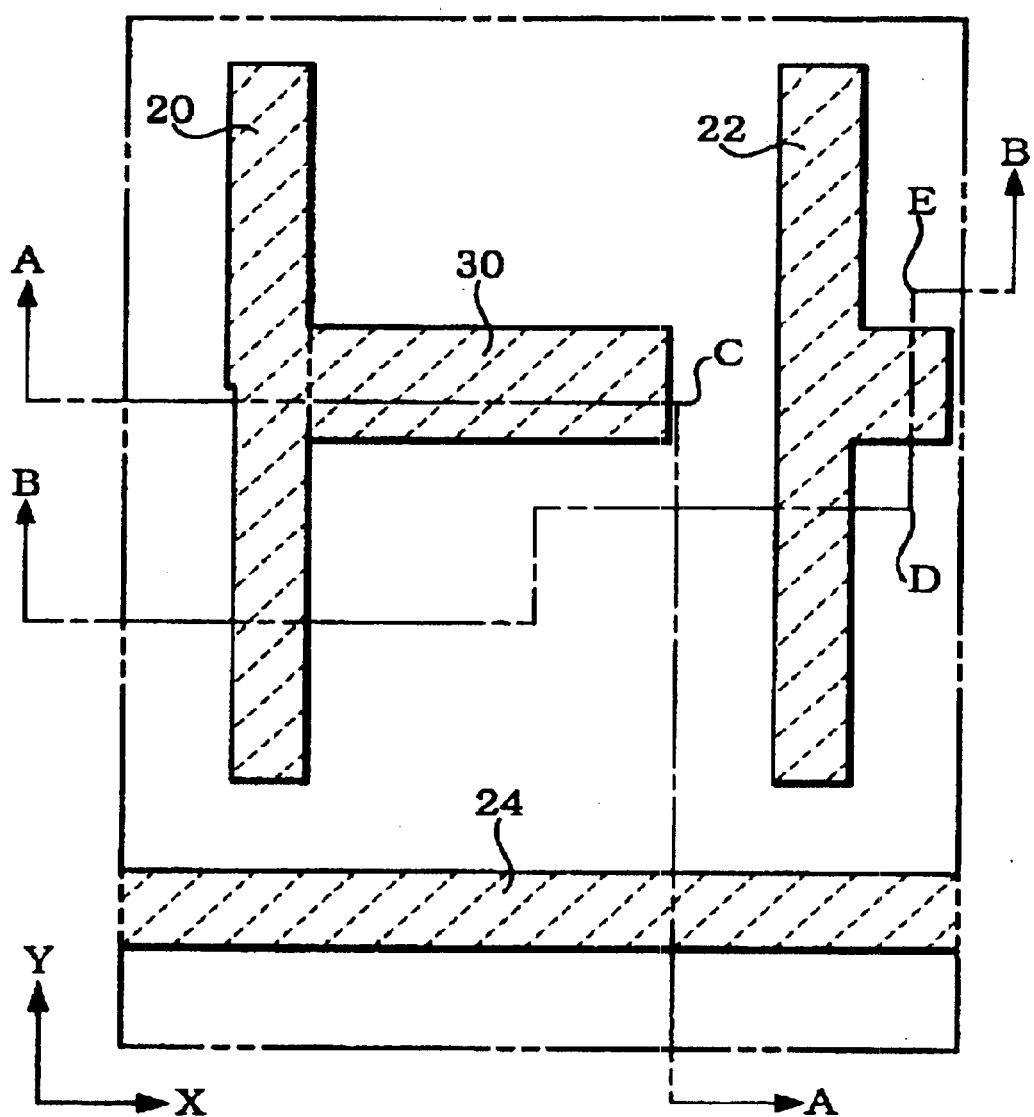
FIG. 3 schematically shows a plan view of a first conductive layer of the memory cell of the SRAM in accordance with the present embodiment.
Figure 4:
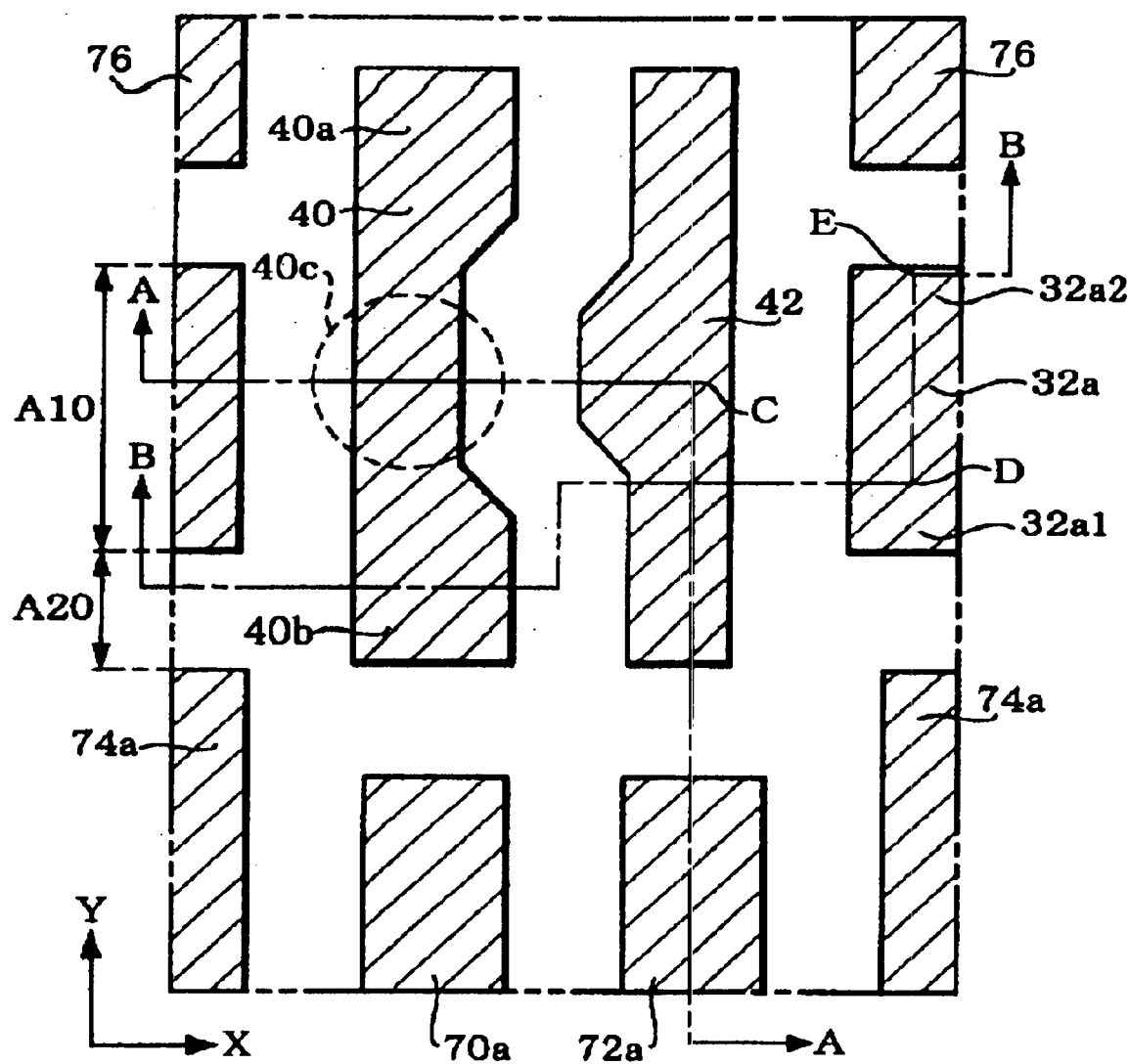
FIG. 4 schematically shows a plan view of a second conductive layer of the memory cell of the SRAM in accordance with the present embodiment.
Figure 5:
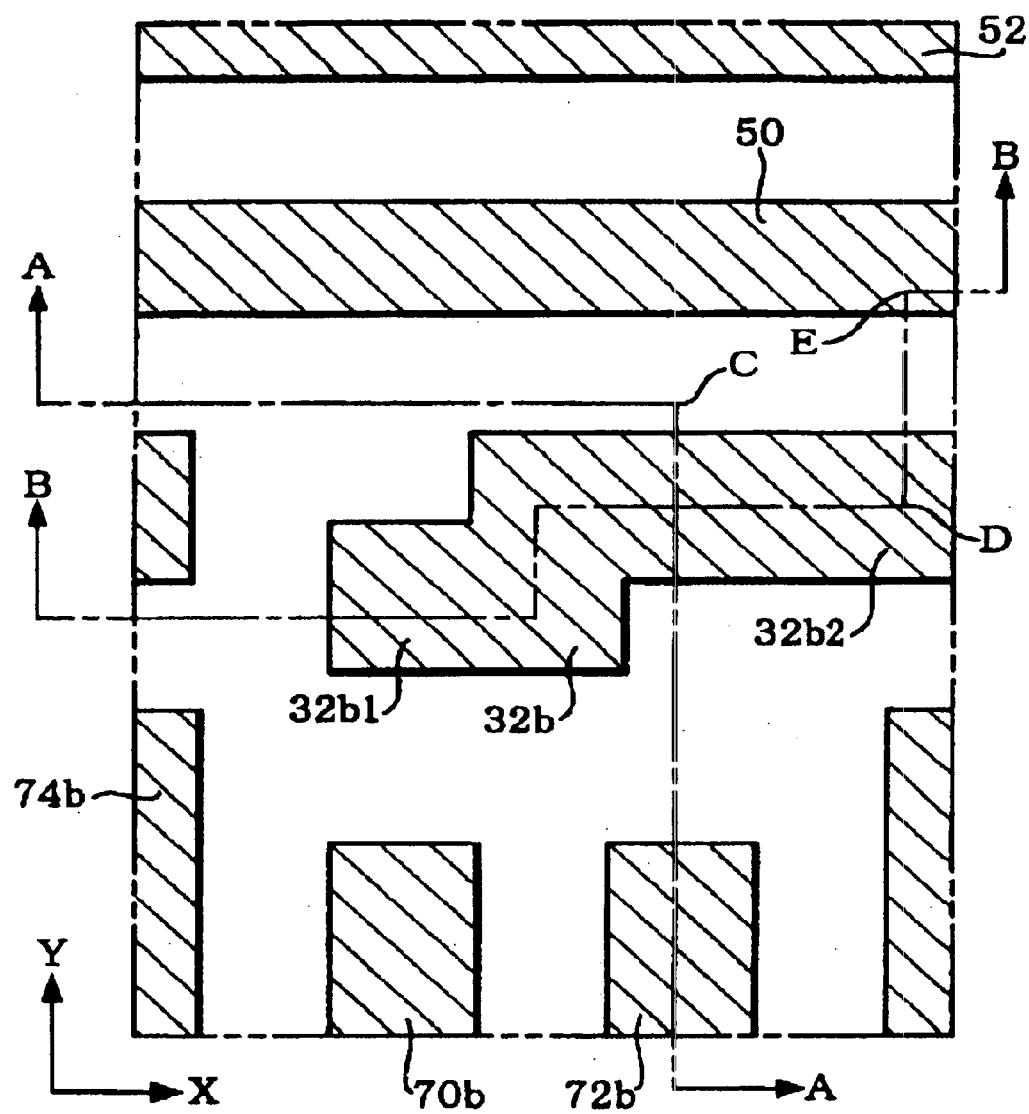
FIG. 5 schematically shows a plan view of a third conductive layer of the memory cell of the SRAM in accordance with the present embodiment.
Figure 6:
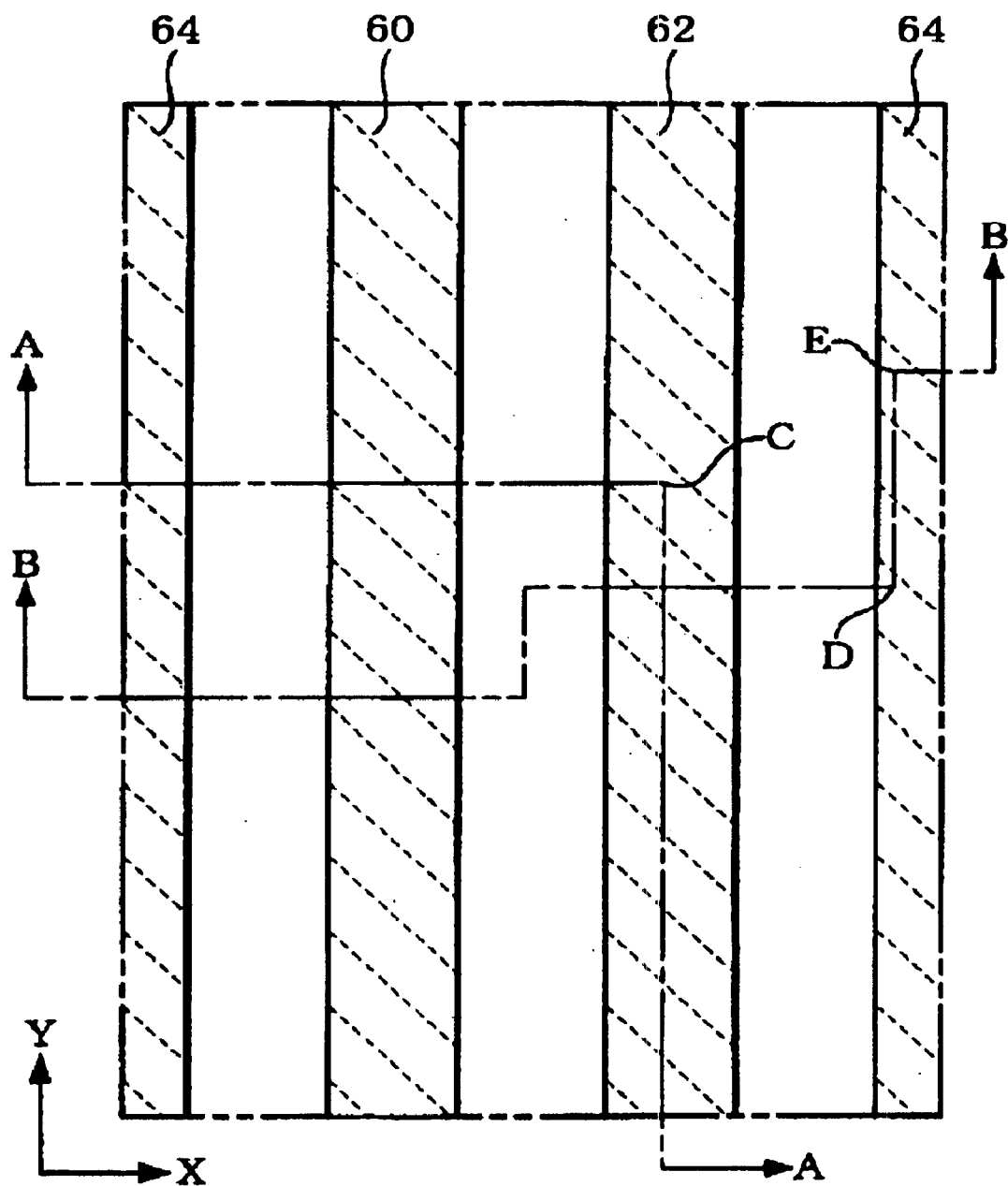
FIG. 6 schematically shows a plan view of a fourth conductive layer of the memory cell of the SRAM in accordance with the present embodiment.
Figure 7:
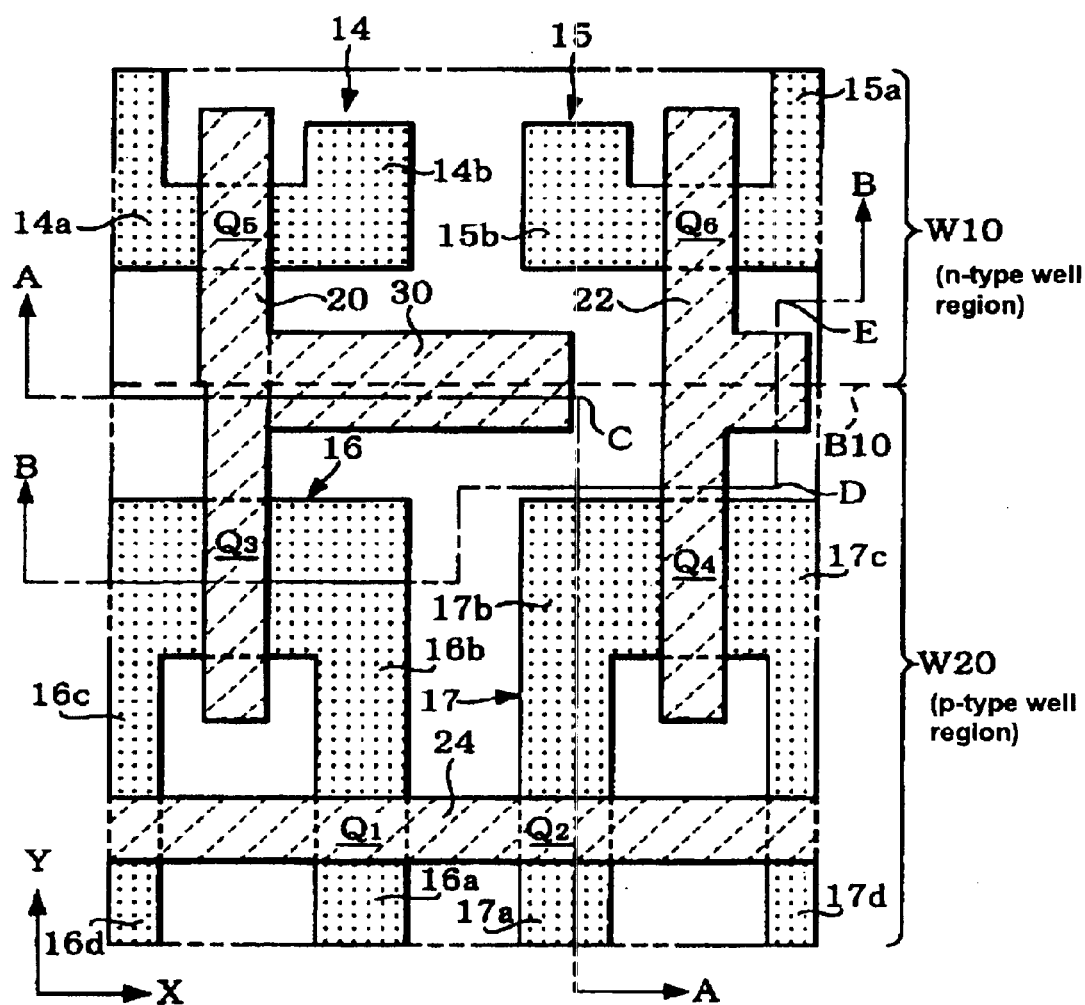
FIG. 7 schematically shows a plan view of the field and the first conductive layer of the memory cell of the SRAM in accordance with the present embodiment.
Figure 8:
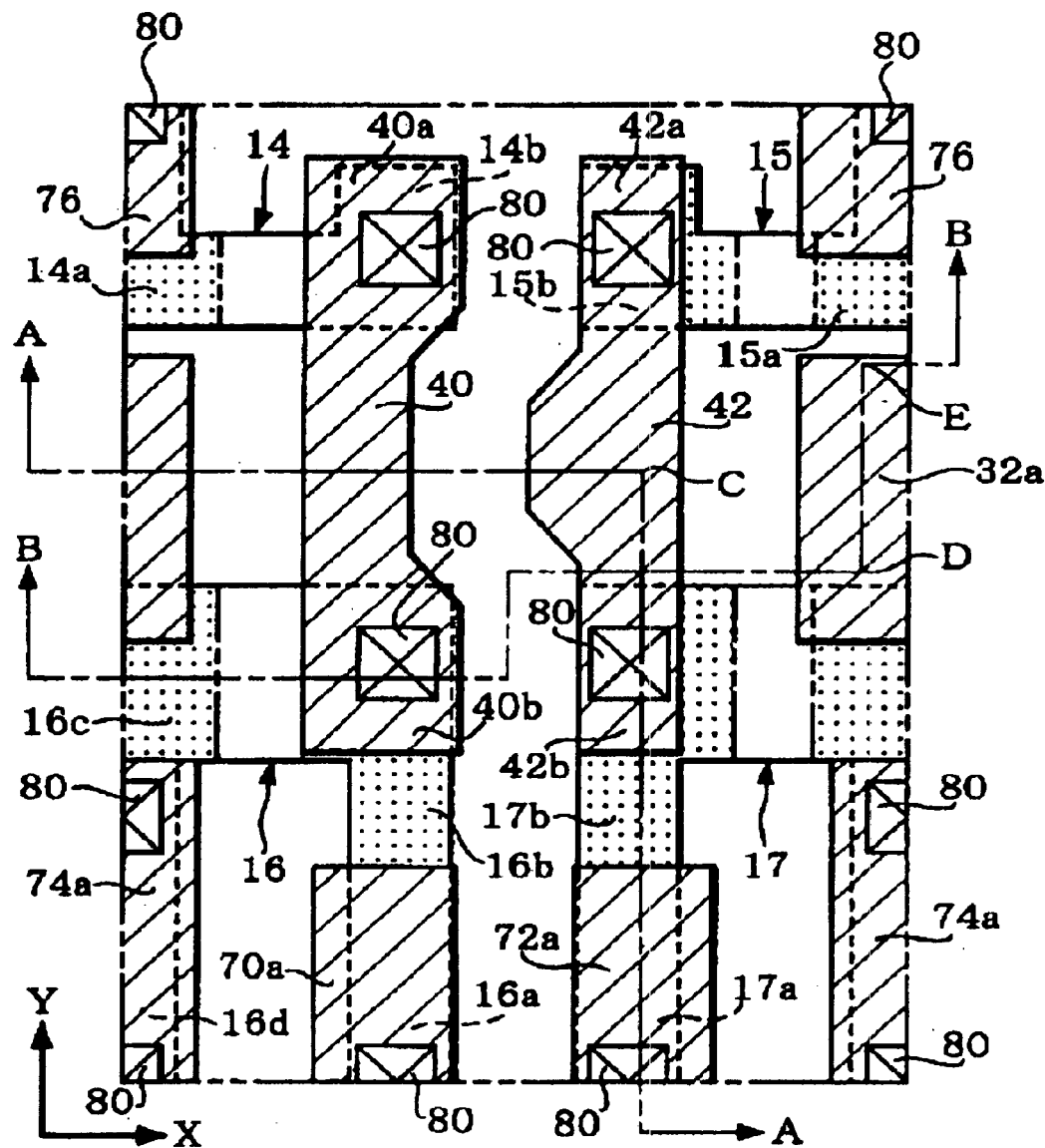
FIG. 8 schematically shows a plan view of the field and the second conductive layer of the memory cell of the SRAM in accordance with the present embodiment.
Figure 9:
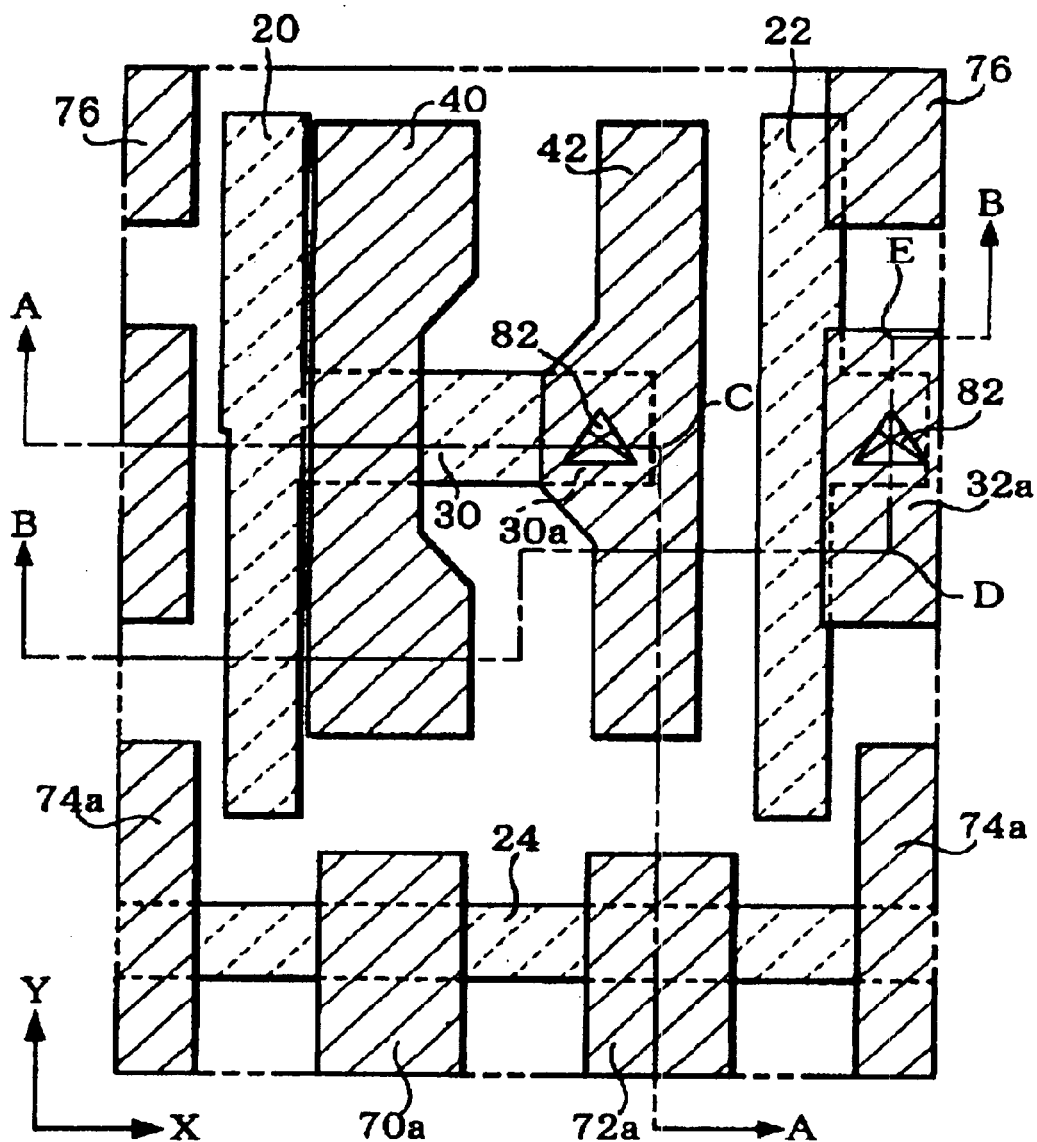
FIG. 9 schematically shows a plan view of the first conductive layer and the second conductive layer of the memory cell of the SRAM in accordance with the present embodiment.
Figure 10:
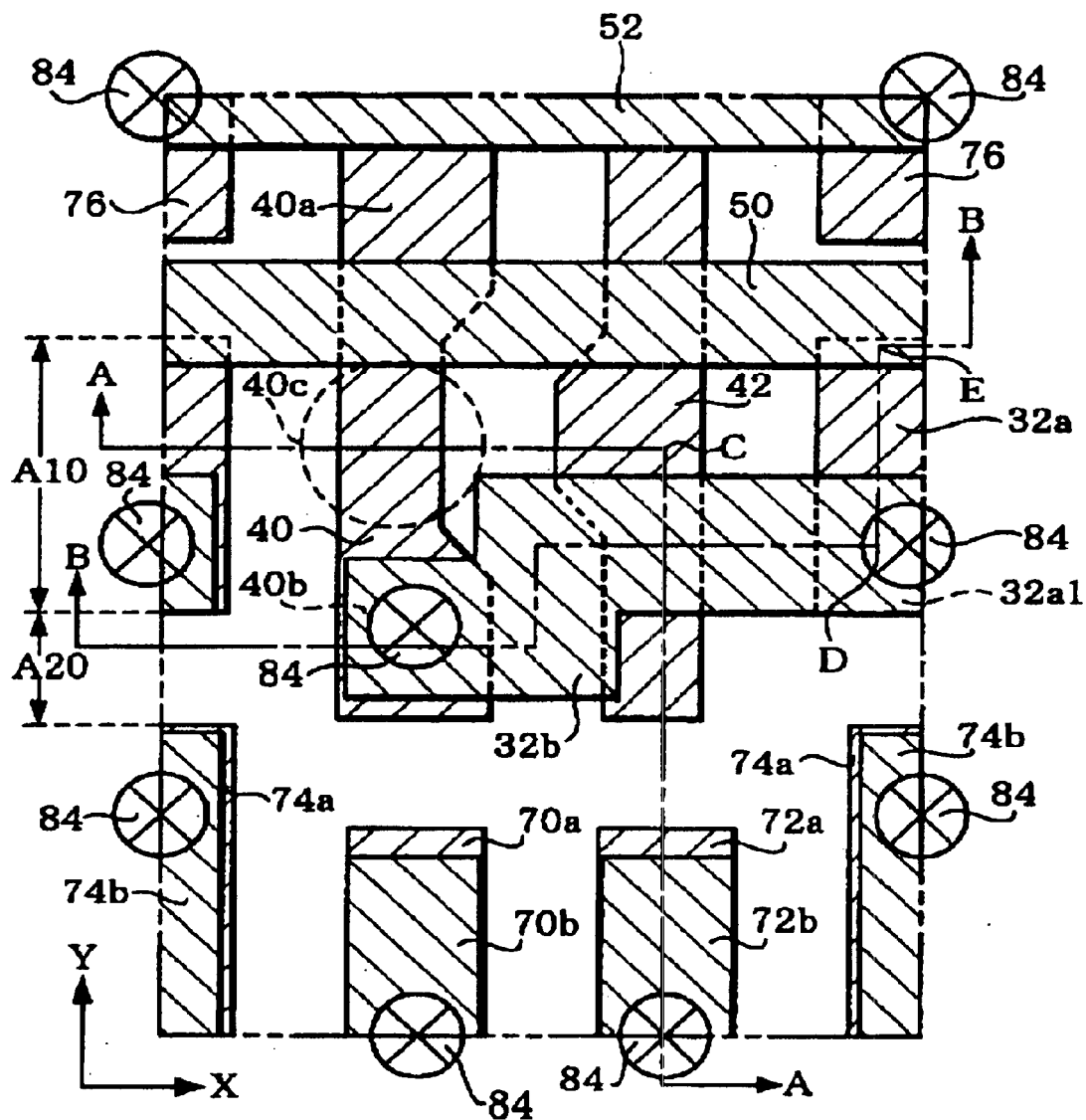
FIG. 10 schematically shows a plan view of the second conductive layer and the third conductive layer of the memory cell of the SRAM in accordance with the present embodiment.
Figure 11:
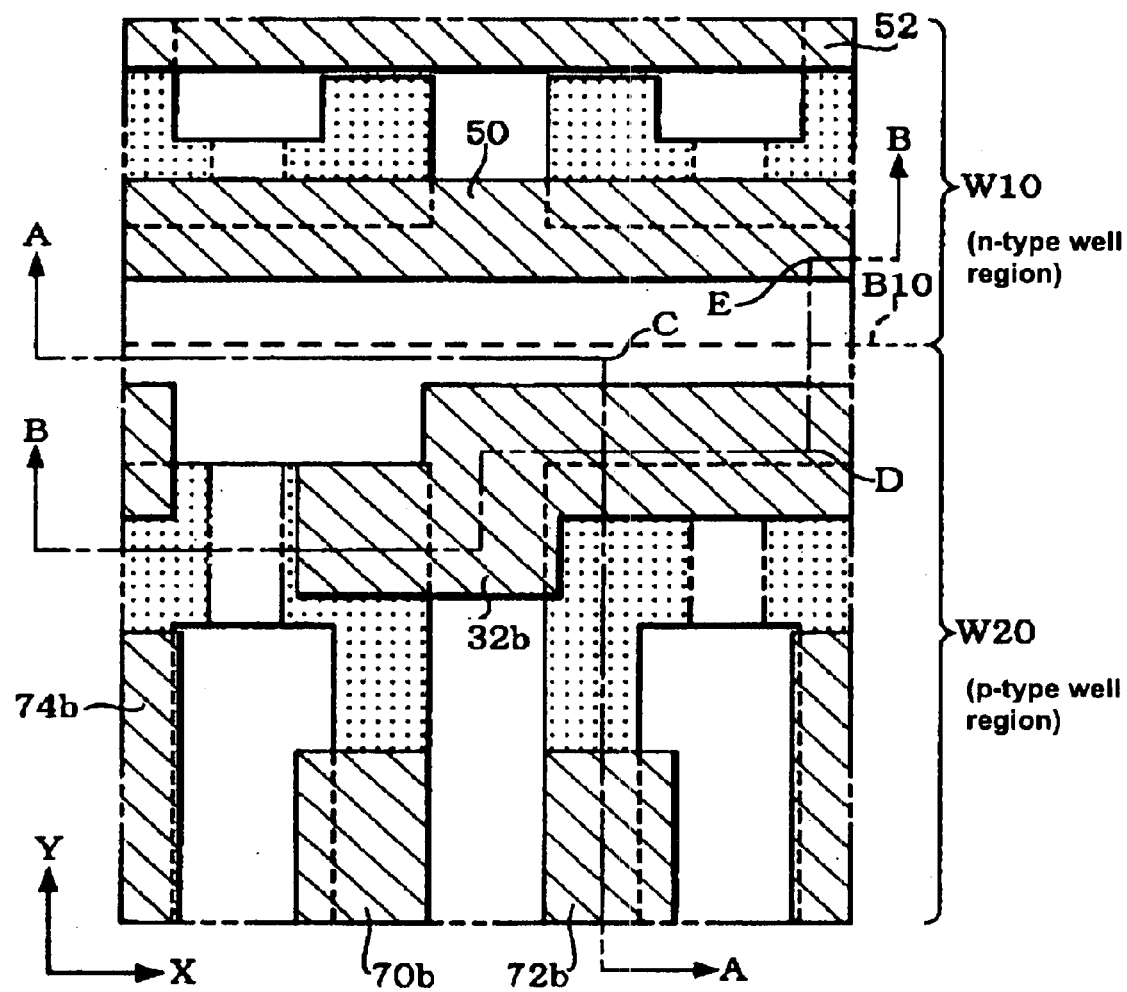
FIG. 11 schematically shows a plan view of the field and the third conductive layer of the memory cell of the SRAM in accordance with the present embodiment.
Figure 12:
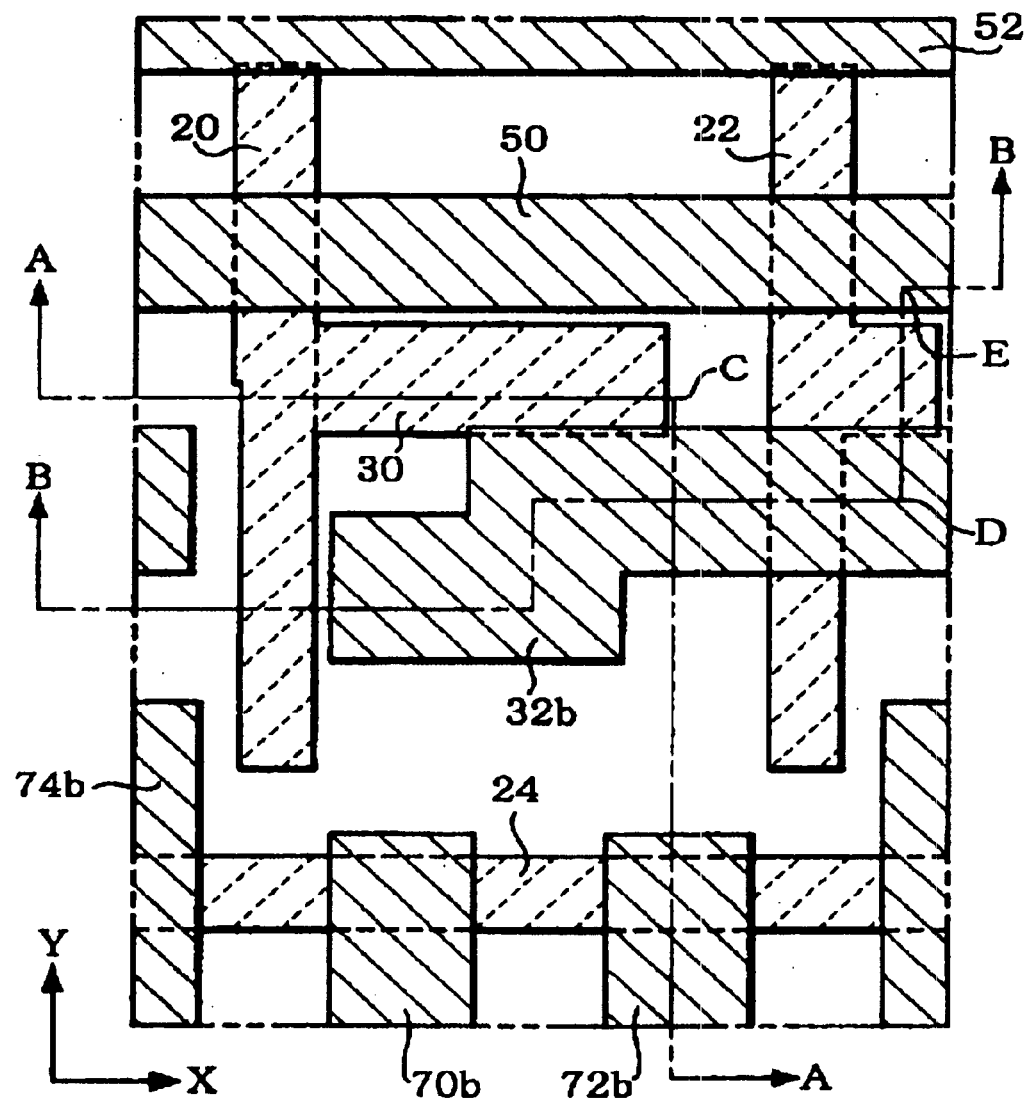
FIG. 12 schematically shows a plan view of the first conductive layer and the third conductive layer of the memory cell of the SRAM in accordance with the present embodiment.
Figure 13:
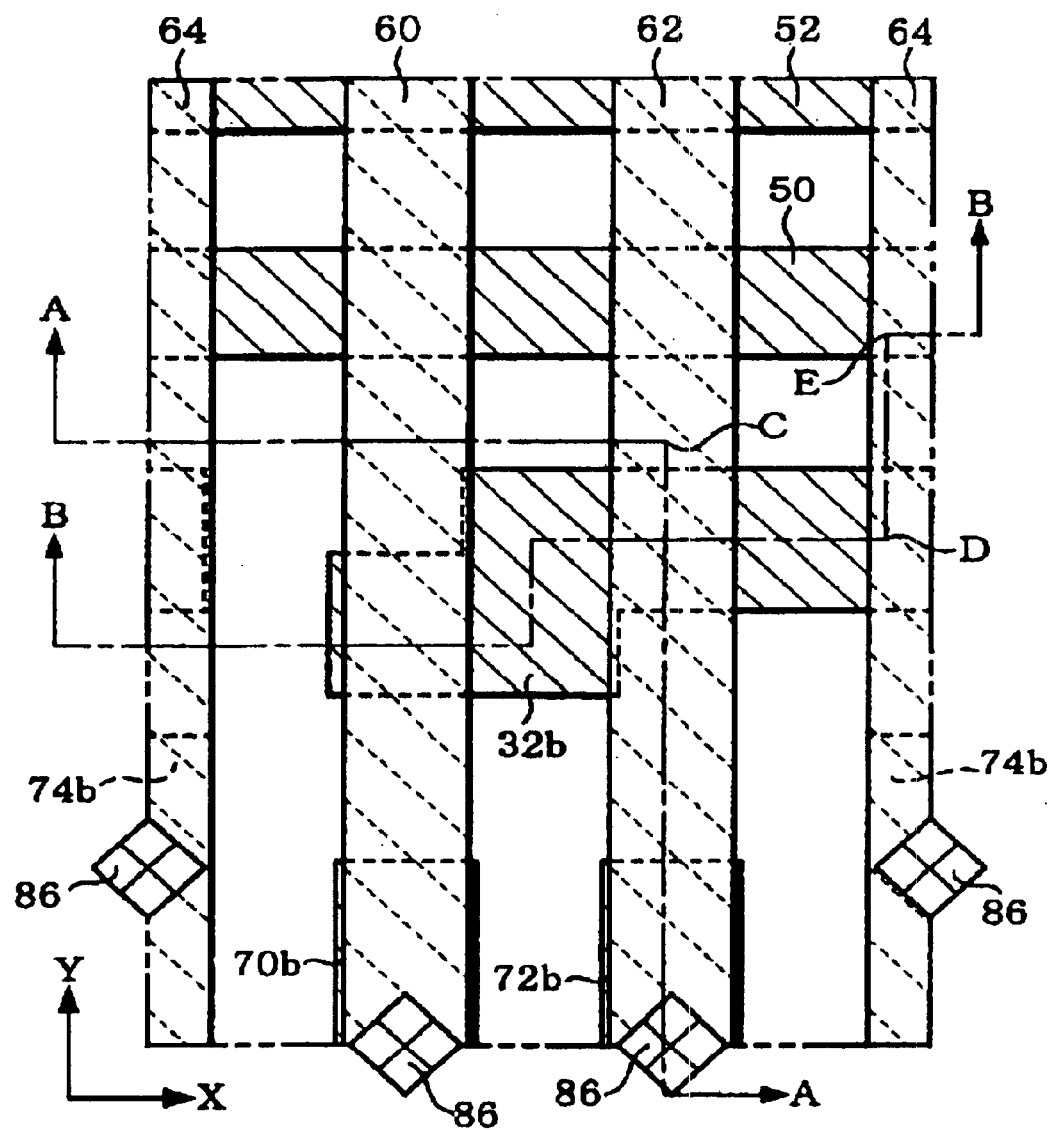
FIG. 13 schematically shows a plan view of the third conductive layer and the fourth conductive layer of the memory cell of the SRAM in accordance with the present embodiment.
Figure 14:
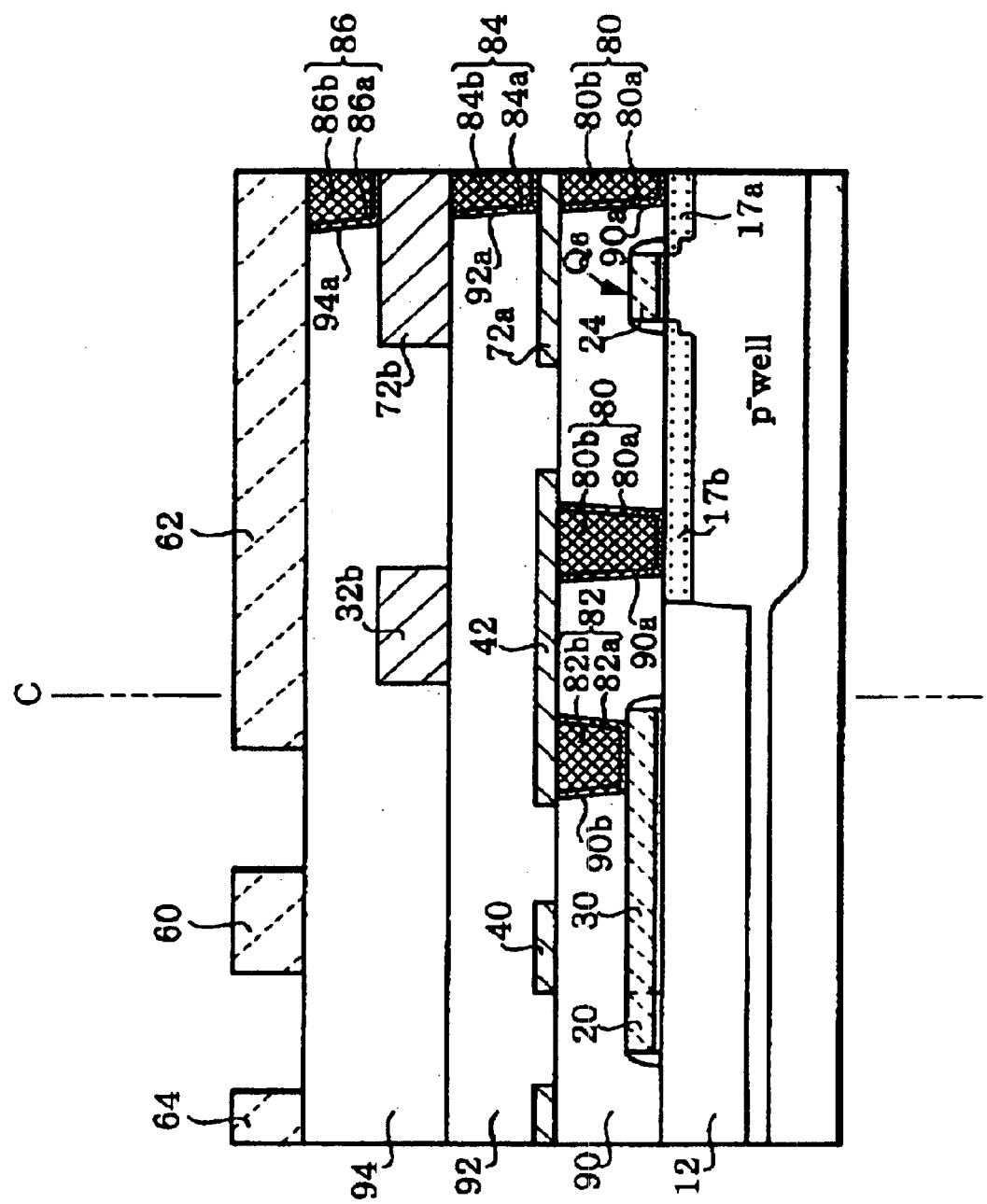
FIG. 14 schematically shows a cross-sectional view taken along a line A—A shown in FIG. 2 to FIG. 13.
Figure 15:
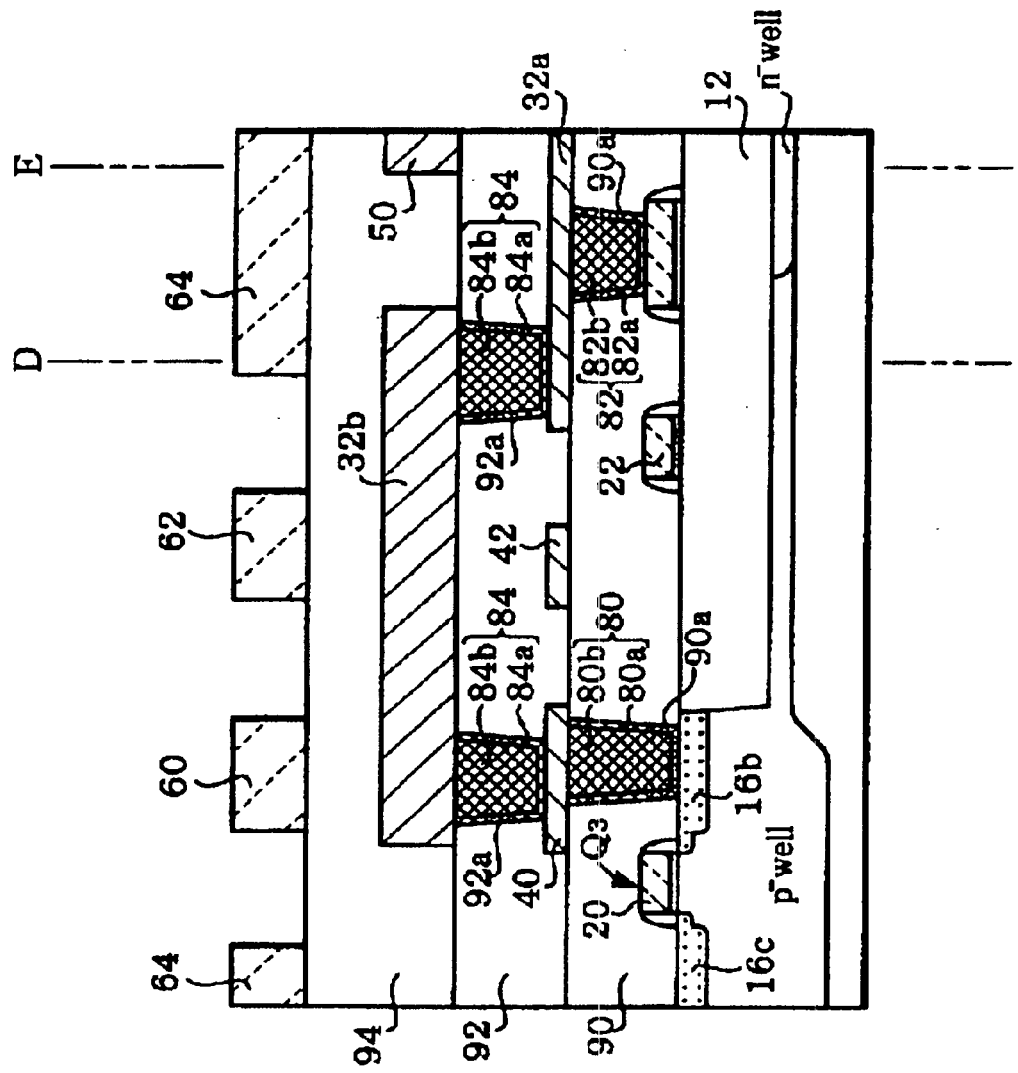
FIG. 15 schematically shows a cross-sectional view taken along a line B—B shown in FIG. 2 to FIG. 13.

FIG. 1 shows a relationship between an equivalent circuit of an SRAM in accordance with the present embodiment and corresponding conductive layers. FIG. 2 schematically shows a plan view of a field of the memory cell of the SRAM in accordance with the present embodiment. FIG. 3 schematically shows a plan view of a first conductive layer of the memory cell of the SRAM in accordance with the present embodiment. FIG. 4 schematically shows a plan view of a second conductive layer of the memory cell of the SRAM in accordance with the present embodiment. FIG. 5 schematically shows a plan view of a third conductive layer of the memory cell of the SRAM in accordance with the present embodiment. FIG. 6 schematically shows a plan view of a fourth conductive layer of the memory cell of the SRAM in accordance with the present embodiment. FIG. 7 schematically shows a plan view of the field and the first conductive layer of the memory cell of the SRAM in accordance with the present embodiment. FIG. 8 schematically shows a plan view of the field and the second conductive layer of the memory cell of the SRAM in accordance with the present embodiment. FIG. 9 schematically shows a plan view of the first conductive layer and the second conductive layer of the memory cell of the SRAM in accordance with the present embodiment. FIG. 10 schematically shows a plan view of the second conductive layer and the third conductive layer of the memory cell of the SRAM in accordance with the present embodiment. FIG. 11 schematically shows a plan view of the field and the third conductive layer of the memory cell of the SRAM in accordance with the present embodiment. FIG. 12 schematically shows a plan view of the first conductive layer and the third conductive layer of the memory cell of the SRAM in accordance with the present embodiment. FIG. 13 schematically shows a plan view of the third conductive layer and the fourth conductive layer of the memory cell of the SRAM in accordance with the present embodiment. FIG. 14 schematically shows a cross-sectional view taken along a line A—A shown in FIG. 2 to FIG. 13. FIG. 15 schematically shows a cross-sectional view taken along a line B—B shown in FIG. 2 to FIG. 13.

The SRAM is formed including an element forming region formed in a field, a first conductive layer, a second conductive layer, a third conductive layer, and a fourth conductive layer. The structure of each of the field, and the first through fourth conductive layers is concretely described below.

2.1 Field

Referring to FIG. 2, the field is described. The field includes first through fourth active regions 14, 15, 16 and 17, and an element isolation region 12. The first through fourth active regions 14, 15, 16 and 17 are defined by the element isolation region 12. A region on the side where the first and second active regions 14 and 15 are formed is an n-type well region W10, and a region on the side where the third and fourth active regions 16 and 17 are formed is a p-type well region W20.

The first active region 14 and the second active region 15 are disposed in a symmetrical relation. Also, the third active region 16 and the fourth active region 17 are disposed in a symmetrical relation.

The first load transistor Q5 is formed in the first active region 14. In the first active region 14, a first $p^+$-type impurity layer 14a and a second $p^+$-type impurity layer 14b are formed. The first $p^+$-type impurity layer 14a functions as a source of the first load transistor Q5. The second $p^+$-type impurity layer 14b functions as a drain of the first load transistor Q5.

The second load transistor Q6 is formed in the second active region 15. In the second active region 15, a third $p^+$-type impurity layer 15a and a fourth $p^+$-type impurity layer 15b are formed. The third $p^+$-type impurity layer 15a functions as a source of the second load transistor Q6. The fourth $p^+$-type impurity layer 15b functions as a drain of the second load transistor Q6.

In the third active region 16, the first driver transistor Q3 and the first transfer transistor Q1 are formed. In the third active region 16, first through third $n^+$-type impurity layers 16a, 16b and 16c that are to become components of the transistors Q1 and Q3, and a fifth $p^+$-type impurity layer 16d that composes a well contact region are formed. The first $n^+$-type impurity layer 16a functions as a source or a drain of the first transfer transistor Q1. The second $n^+$-type impurity layer 16b functions as a drain of the first driver transistor Q3, and a source or a drain of the first transfer transistor Q1. The third $n^+$-type impurity layer 16c functions as a source of the first driver transistor Q3.

In the fourth active region 17, the second driver transistor Q4 and the second transfer transistor Q2 are formed. In the fourth active region 17, fourth through sixth $n^+$-type impurity layers 17a, 17b and 17c that are to become components of the transistors Q2 and Q4, and a sixth $p^+$-type impurity layer 17d that composes a well contact region are formed. The fourth $n^+$-type impurity layer 17a functions as a source or a drain of the second transfer transistor Q2. The fifth $n^+$-type impurity layer 17b functions as a drain of the second driver transistor Q4, and a source or a drain of the second transfer transistor Q2. The sixth $n^+$-type impurity layer 17c functions as a source of the second driver transistor Q4.

2.2 First Conductive Layer

Next, referring to FIG. 3 and FIG. 7, the first conductive layer is described. It is noted that the first conductive layer means a conductive layer that is formed on the semiconductor layer 10.

The first conductive layer includes a first gate-gate electrode layer 20, a second gate-gate electrode layer 22, a first drain-gate wiring layer 30 and an auxiliary word line 24.

The first gate-gate electrode layer 20 and the second gate-gate electrode layer 22 are formed in a manner to extend along a Y direction. The first drain-gate wiring layer 30 and the auxiliary word line 24 are formed in a manner to extend along an X direction.

Components of the first conductive layer are described concretely below.

1) First Gate-Gate Electrode Layer

The first gate-gate electrode layer 20 is formed in a manner to traverse the first active region 14 and the third active region 16, as shown in FIG. 7. The first gate-gate electrode layer 20 functions as a gate electrode of the first load transistor Q5 and the first driver transistor Q3.

The first gate-gate electrode layer 20 is formed in a manner to pass between the first $p^+$-type impurity layer 14a and the second $p^+$-type impurity layer 14b, in the first active region 14. In other words, the first gate-gate electrode layer 20, the first $p^+$-type impurity layer 14a and the second $p^+$-type impurity layer 14b form the first load transistor Q5. Also, the first gate-gate electrode layer 20 is formed in a manner to pass between the second $n^+$-type impurity layer 16a and the third $n^+$-type impurity layer 16c, in the third active region 16. In other words, the first gate-gate electrode layer 20, the second n⁺-type impurity layer 16a and the third n⁺-type impurity layer 16c form the first driver transistor Q3.

2) First Drain-Gate Wiring Layer

The first drain-gate wiring layer 30 is formed in a manner to extend in the X direction from a side section of the first gate-gate electrode layer 20 toward the second gate-gate electrode layer 22. Also, as shown in FIG. 7, the first drain-gate wiring layer 30 is formed at least between the first active region 14 and the third active region 16. The first drain-gate wiring layer 30 is formed over a border B10 between the n-type well region W10 and the p-type well region W20. The first drain-gate wiring layer 30 may be formed such that the center line of the first drain-gate wiring layer 30 superposes on the border B10 as viewed in a plan view thereof.

3) Second Gate-Gate Electrode Layer

The second gate-gate electrode layer 22 is formed in a manner to traverse the second active region 15 and the fourth active region 17, as shown in FIG. 7. The second gate-gate electrode layer 22 functions as a gate electrode of the second load transistor Q6 and the second driver transistor Q4.

The second gate-gate electrode layer 22 is formed in a manner to pass between the third p⁺-type impurity layer 15a and the fourth p⁺-type impurity layer 15b, in the second active region 15. In other words, the second gate-gate electrode layer 22, the third p⁺-type impurity layer 15a and the fourth p⁺-type impurity layer 15b form the second load transistor Q6. Also, the second gate-gate electrode layer 22 is formed in a manner to pass between the fifth n⁺-type impurity layer 17b and the sixth n⁺-type impurity layer 17c, in the fourth active region 17. In other words, the second gate-gate electrode layer 22, the fifth n⁺-type impurity layer 17b and the sixth n⁺-type impurity layer 17c form the second driver transistor Q4.

4) Auxiliary Word Line

The auxiliary word line 24 is formed in a manner to traverse the third active region 16 and the fourth active region 17, as shown in FIG. 7. The auxiliary word line 24 functions as a gate electrode of the first and second transfer transistors Q1 and Q2.

The auxiliary word line 24 is formed in a manner to pass between the first n⁺-type impurity layer 16a and the second n⁺-type impurity layer 16b, in the third active region 16. In other words, the auxiliary word line 24, the first n⁺-type impurity layer 16a and the second n⁺-type impurity layer 16b form the first transfer transistor Q1. Also, the auxiliary word line 24 is formed in a manner to pass between the fourth n⁺-type impurity layer 17a and the fifth n⁺-type impurity layer 17b, in the fourth active region 17. In other words, the auxiliary word line 24, the fourth n⁺-type impurity layer 17a and the fifth n⁺-type impurity layer 17b form the second transfer transistor Q2.

5) Cross-sectional Structure of First Conductive Layer and Others

The first conductive layer may be formed by successively depositing a polysilicon layer and a silicide layer in layers.

As shown in FIG. 14 and FIG. 15, a first interlayer dielectric layer 90 is formed on the field and the first conductive layer. The first interlayer dielectric layer 90 may be formed through a planarization process utilizing, for example, a chemical mechanical polishing method.

2.3 Second Conductive Layer

Referring to FIG. 4, FIG. 8 and FIG. 9, the second conductive layer is described below. It is noted that the second conductive layer means a conductive layer that is formed on the first interlayer dielectric layer 90.

The second conductive layer includes, as shown in FIG. 4, a first drain-drain wiring layer 40, a second drain-drain wiring layer 42, a lower layer 32a of the second drain-gate wiring layer, a first BL contact pad layer 70a, a first bar-BL contact pad layer 72a, a first Vss contact pad layer 74a and a Vdd contact pad layer 76.

The first drain-drain wiring layer 40, the second drain-drain wiring layer 42 and the lower layer 32a are formed in a manner to extend along the Y direction. The first drain-drain wiring layer 40, the second drain-drain wiring layer 42 and the lower layer 32a are successively disposed in the X direction.

Components of the second conductive layer are concretely described below.

1) First Drain-Drain Wiring Layer

The first drain-drain wiring layer 40 has portions that overlap the first active region 14 and the third active region 16 as viewed in a plan view (see FIG. 8). More concretely, one end section 40a of the first drain-drain wiring layer 40 is located above the second p⁺-type impurity layer 14b. The one end section 40a of the first drain-drain wiring layer 40 and the second p⁺-type impurity layer 14b are electrically connected to each other through a contact section between the field and the second conductive layer (herein blew referred to as a "field/second-layer contact section") 80. The other end section 40b of the first drain-drain wiring layer 40 is located above the second n⁺-type impurity layer 16b. The other end section 40b of the first drain-drain wiring layer 40 and the second n⁺-type impurity layer 16b are electrically connected to each other through the field/second-layer contact section 80. Also, the end sections 40a and 40b of the first drain-drain wiring layer 40 can be set to have a greater width than that of the section 40c of the first drain-drain wiring layer 40 in the region A10 where three lines are present in the X direction.

2) Second Drain-Drain Wiring Layer

The second drain-drain wiring layer 42 has portions that overlap the second active region 15 and the fourth active region 17 as viewed in a plan view (see FIG. 8). More concretely, one end section 42a of the second drain-drain wiring layer 42 is located above the fourth p⁺-type impurity layer 15b. The one end section 42a of the second drain-drain wiring layer 42 and the fourth p⁺-type impurity layer 15b are electrically connected to each other through the field/second-layer contact section 80. The other end section 42b of the second drain-drain wiring layer 42 is located above the fifth n⁺-type impurity layer 17b. The other end section 42b of the second drain-drain wiring layer 42 and the fifth n⁺-type impurity layer 17b are electrically connected to each other through the field/second-layer contact section 80.

Further, the second drain-drain wiring layer 42 has a portion that overlaps an end section 30a of the first drain-gate wiring layer 30 as viewed in a plan view (see FIG. 9). The second drain-drain wiring layer 42 and the end section 30a of the first drain-gate wiring layer 30 are electrically connected to each other through a contact section between the first conductive layer and the second conductive layer (hereafter referred to as a "first-layer/second-layer contact section") 82.

3) Lower layer of Second Drain-Gate Wiring Layer

The lower layer 32a is formed on the opposite side of the first drain-drain wiring layer 40 with respect to the second drain-drain wiring layer 42 as being a reference. The lower layer 32a has a portion that overlaps the second gate-gate electrode layer 22 as viewed in a plan view (see FIG. 9). The lower layer 32a of the second drain-gate wiring layer, and the second gate-gate electrode layer 22 are electrically connected to each other through the first-layer/second-layer contact section 82.

4) First BL Contact Pad Layer

The first BL contact pad layer 70a is located above the first n+-type impurity layer 16a in the third active region 16 (see FIG. 8). The first BL contact pad layer 70a and the first n+-type impurity layer 16a are electrically connected to each other through the field/second-layer contact section 80.

5) First Bar-BL Contact Pad Layer

The first bar-BL contact pad layer 72a is located above the fourth n+-type impurity layer 17a in the fourth active region 17 (see FIG. 8). The first bar-BL contact pad layer 72a and the fourth n+-type impurity layer 17a are electrically connected to each other through the field/second-layer contact section 80.

6) First Vss Contact Pad Layer

The first Vss contact pad layers 74a are located above the sources of the driver transistors Q3 and Q4 (for example, the third n+-type impurity layer 16c) and the well contact region (for example, the fifth p+-type impurity layer 16d) (see FIG. 8). Each of the first Vss contact pad layers 74a is electrically connected to the source of each of the driver transistors Q3 and Q4 (for example, the third n+-type impurity layer 16c) through the field/second-layer contact section 80. Also, the first Vss contact pad layer 74a is electrically connected to the well contact region (for example, the fifth p+-type impurity layer 16d) through the field/second-layer contact section 80.

7) Vdd Contact Pad Layer

Each of the Vdd contact pad layers 76 is located above the source (for example, the first p+-type impurity layer 14a) of each of the load transistors Q5 and Q6. Each of the Vdd contact pad layers 76 is electrically connected to the source (for example, the first p+-type impurity layer 14a) of each of the load transistors Q5 and Q6 through the field/second-layer contact section 80.

8) Cross-Sectional Structure of Second Conductive Layer

Next, a cross-sectional structure of the second conductive layer is described with reference to FIG. 14 and FIG. 15. The second conductive layer may be formed only from, for example, a layer of nitride of a refractory metal. The thickness of the second conductive layer may be for example 100–200 nm, and more preferably be 140–160 nm. The layer of nitride of a refractory metal may be formed from, for example, titanium nitride. Because the second conductive layer is formed from a layer of nitride of a refractory metal, the thickness of the second conductive layer can be made smaller, and miniature processing thereof can be readily conducted. Accordingly, the cell area can be reduced.

Also, the second conductive layer may be composed in either one of the following embodiments. 1) It may have a structure in which a layer of nitride of a refractory metal is formed on a metal layer formed from a refractory metal. In this case, the metal layer formed from a refractory metal is an under-layer, and may be composed of a titanium layer, for example. Titanium nitride may be listed as a material of the layer of nitride of a refractory metal. 2) The second conductive layer may be composed only of a metal layer of a refractory metal.

Next, a cross-sectional structure of the field/second-layer contact section 80 is described with reference to FIG. 14 and FIG. 15. The field/second-layer contact section 80 is formed in a manner to fill a through hole 90a that is formed in the first interlayer dielectric layer 90. The field/second-layer contact section 80 includes a barrier layer 80a, and a plug 80b formed over the barrier layer 80a. Titanium and tungsten may be listed as material of the plugs. The barrier layer 80a may preferably be formed from a metal layer of a refractory metal, and a layer of nitride of a refractory metal formed over the metal layer. For example, titanium may be listed as material of the metal layer of a refractory metal. Titanium nitride, for example, may be listed as material of the layer of nitride of a refractory metal.

Next, a cross-sectional structure of the first-layer/second-layer contact section 82 is described with reference to FIG. 14 and FIG. 15. The first-layer/second-layer contact section 82 is formed in a manner to fill a through hole 90b that is formed in the first interlayer dielectric layer 90. The first-layer/second-layer contact section 82 may have the same structure as that of the field/second-layer contact section 80 described above.

A second interlayer dielectric layer 92 is formed in a manner to cover the second conductive layer. The second interlayer dielectric layer 92 may be formed through a planarization process using, for example, a chemical mechanical polishing method.

2.4 Third Conductive Layer

The third conductive layer is described below with reference to FIG. 5 and FIG. 10 through FIG. 12. It is noted that the third conductive layer means a conductive layer that is formed on the second interlayer dielectric layer 92 (see FIG. 14 and FIG. 15).

The third conductive layer includes an upper layer 32b of the second drain-gate wiring layer, a main word line 50, a Vdd wiring 52, a second BL contact pad layer 70b, a second bar-BL contact pad layer 72b and a second Vss contact pad layer 74b.

The upper layer 32b, the main word line 50 and the Vdd wiring 53 are formed in a manner to extend along the X direction. The second BL contact pad layer 70b, the second bar-BL contact pad layer 72b and the second Vss contact pad layer 74b are formed in a manner to extend in the Y direction.

Components of the third conductive layer are concretely described below.

1) Upper Layer of the Second Drain-Gate Wiring Layer

The upper layer 32b of the second drain-gate wiring layer is formed in a manner to traverse the second drain-drain wiring layer 42 in the second conductive layer, as shown in FIG. 10. More concretely, the upper layer 32b is formed from an area above the end section 40b of the first drain-drain wiring layer 40 to an area above an end section 32a1 of the lower layer 32a. The upper layer 32b is electrically connected to the end section 40b of the first drain-drain wiring layer 40 through a contact section between the second conductive layer and the third conductive layer (herein after referred to as a "second-layer/third-layer contact section") 84. Also, the upper layer 32b is electrically connected to the end section 32a1 of the lower layer 32a through the second-layer/third-layer contact section 84.

The upper layer 32b is provided above the p-type well region W20 without exceeding the border B10 between the n-type well region W10 and the p-type well region W20, as shown in FIG. 11. Effects obtained by providing the upper layer 32b will be described below in a section "Effects".

As shown in FIG. 1, the first drain-drain wiring layer 40 in the second conductive layer and the second gate-gate electrode layer 22 in the first conductive layer are electrically connected to each other through the second-layer/third-layer contact section 84, the upper layer 32b, the second-layer/third-layer contact section 84, the lower layer 32a, and the first-layer/second-layer contact section 82.

2) Vdd Wiring

The Vdd wiring 52 is formed in a manner to pass over the Vdd contact pad layer 76, as shown in FIG. 10. The Vdd wiring 52 is electrically connected to the Vdd contact pad layer 76 through the second-layer/third-layer contact section 84.

3) Second BL Contact Pad Layer

The second BL contact pad layer 70b is located above the first BL contact pad layer 70a. The second BL contact pad layer 70b is electrically connected to the first BL contact pad layer 70a through the second-layer/third-layer contact section 84.

4) Second Bar-BL Contact Pad Layer

The second bar-BL contact pad layer 72b is located above the first bar-BL contact pad layer 72a. The second bar-BL contact pad layer 72b is electrically connected to the first bar-BL contact pad layer 72a through the second-layer/third-layer contact section 84.

5) Second Vss Contact Pad Layer

The second Vss contact pad layer 74b is located above the second Vss contact pad layer 74a. The second Vss contact pad layer 74b is electrically connected to the first Vss contact pad layer 74a through the second-layer/third-layer contact section 84.

6) Cross-sectional Structure of Third Conductive Layer

Next, across-sectional structure of the third conductive layer is described with reference to FIG. 14 and FIG. 15. The third conductive layer has a structure in which, for example, a layer of nitride of a refractory metal, a metal layer, and a layer of nitride of a refractory metal, in this order from the bottom, are successively stacked in layers. For example, titanium nitride may be listed as material of the layer of nitride of a refractory metal. Aluminum, copper or an alloy of these metals, for example, may be listed as material of the metal layer.

Next, a cross-sectional structure of the second-layer/third-layer contact section 84 is described. The second-layer/third-layer contact section 84 is formed in a manner to fill a through hole 92a formed in the second interlayer dielectric layer 92. The second-layer/third-layer contact section 84 may be provided with the same structure as that of the field/second-layer contact section 80 described above.

A third interlayer dielectric layer 94 is formed in a manner to cover the third conductive layer. The third interlayer dielectric layer 94 may be formed through a planarization process using, for example a chemical mechanical polishing method.

2.5 Fourth Conductive Layer

The fourth conductive layer is described below with reference to FIG. 6 and FIG. 13. It is noted that the fourth conductive layer means a conductive layer that is formed on the third interlayer dielectric layer 94.

The fourth conductive layer includes a bit line 60, a bit-bar line 62 and a Vss wiring 64.

The bit line 60, the bit-bar line 62 and the Vss wiring 64 are formed in a manner to extend along the Y direction.

Compositions of the bit line 60, the bit-bar line 62 and the Vss wiring 64 are concretely described below.

1) Bit Line

The bit line 60 is formed in a manner to pass over the second BL contact pad layer 70b, as shown in FIG. 13. The bit line 60 is electrically connected to the second BL contact pad layer 70b through a contact section between the third conductive layer and the fourth conductive layer (herein below referred to as a "third-layer/fourth-layer contact section") 86.

2) Bit-bar Line

The bit-bar line 62 is formed in a manner to pass over the second bar-BL contact pad layer 72b, as shown in FIG. 13. The bit-bar line 62 is electrically connected to the/second BL contact pad layer 72b through the third-layer/fourth-layer contact section 86.

3) Vss Wiring

The Vss wiring 64 is formed in a manner to pass over the second Vss contact pad layer 74b, as shown in FIG. 13. The Vss wiring 64 is electrically connected to the second Vss contact pad layer 74b through the third-layer/fourth-layer contact section 86.

4) Cross-Sectional Structure of Fourth Conductive Layer

Next, a cross-sectional structure of the fourth conductive layer is described with reference to FIG. 14 and FIG. 15. The fourth conductive layer may have the same structure as the structure of the third conductive layer described above.

Next, a cross-sectional structure of the third-layer/fourth-layer contact section 86 is described. The third-layer/fourth-layer contact section 86 is formed in a manner to fill a through hole 94a that is formed in the third interlayer dielectric layer 94. The third-layer/fourth-layer contact section 86 may have the same structure as the structure of the field/second-layer contact section 80 described above.

Although not shown in FIG. 14 or FIG. 15, a passivation layer may be formed on the fourth conductive layer.

3. Effects

Effects provided by the semiconductor device in accordance with the present embodiment are described below.

(1) In accordance with the present embodiment, the upper layer 32b is provided above the p-type well region W20 without exceeding the border B10 between the n-type well region W10 and the p-type well region W20. This provides, for example, the following effects.

Figure 22:
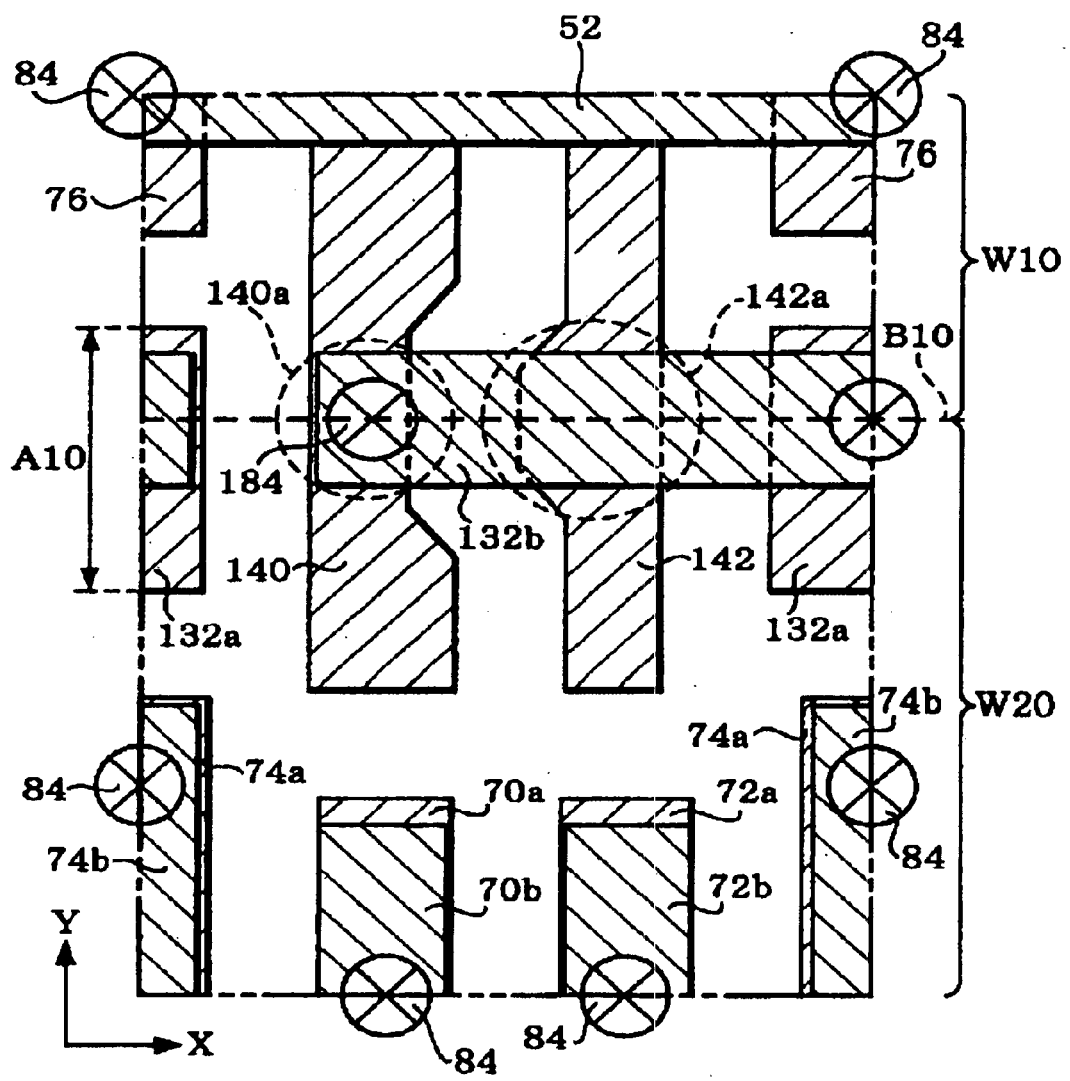
FIG. 22 schematically shows a plan view of a plane of a semiconductor device of an example for comparison.

1) As an example for comparison, as shown in FIG. 22, an upper layer 132b of the second drain-gate wiring layer could be provided in a manner to cross the border B10 between the p-type well region W10 and the n-type well region W20. However, in this case, if a main word line were to be disposed over the n-type well region W10, and the memory cell has a certain restriction in its size, it would be difficult to form the main word line in a gap between the Vdd wiring 52 and the upper layer 132b because the gap is narrow. Also, if a main word line were to be disposed over the p-type well region W20, and the memory cell has a certain restriction in its size, it would be difficult to form the main word line in a gap between the Vss contact pad layer 74b, the contact pad layers 70b and 72b for bit lines, and the upper layer 132b because the gap is narrow.

However, in the present embodiment, as shown in FIG. 11, the upper layer 32b is provided above the p-type well region W20 without exceeding the border B10 between the n-type well region W10 and the p-type well region W20. As a result, a gap between the upper layer 32b and the Vdd wiring 52 is widened by a corresponding amount. Accordingly, the main word line 50 can be readily formed between the upper layer 32b and the Vdd wiring 52 (above the n-type well region W10) without short-circuiting with the wirings 32b and 52. For this reason, a main word line can be readily formed in the third conductive layer.

2) As shown in FIG. 22, let us consider the case in which the upper layer 132b is provided in a manner to extend across the border B10 between the p-type well region W10 and the n-type well region W20. In this case, a contact section 184 between the upper layer 132b and the first drain-drain wiring layer 140 is provided over a section 140a of the first drain-drain wiring layer 140 in the region A10 where three lines are present in the X direction. The region A10 where the three lines are present in the X direction does not have room for a space to form the contact section 184. Accordingly, it is difficult to provide the contact section 184 over the section 140a of the first drain-drain wiring layer 140. In other words, there are occasions in which the contact section 184 may be short-circuited with the lower layer 132a or the second drain-drain wiring layer 142.

However, in accordance with the present embodiment, the upper layer 32b is provided above the p-type well region W20 without exceeding the border B10 between the n-type well region W10 and the p-type well region W20. As a result, as shown in FIG. 10, the contact section 84 can be formed over the end section 40b of the first drain-drain wiring layer 40 in the region A20 where two lines are present in the X direction. The region A20 where two lines are present in the X direction has more room for the space to form the contact section 84 than the region A10 where three lines are present in the X direction. For this reason, the contact section 84 can be more readily formed by the corresponding degree without being short-circuited with the second drain-drain wiring layer 42 and the lower layer 32a.

Also, as shown in FIG. 10, the contact section 84 can be provided over the end section 40b of the first drain-drain wiring layer. The width of the end section 40b of the first drain-drain wiring layer 40 can be set wider. As a result, the contact section 84 may be readily formed without extending out the first drain-drain wiring layer 40.

(2) A first drain-gate wiring layer and a second drain-gate wiring layer could be formed in the same conductive layer. However, in this case, it is difficult to reduce the cell area due to the high pattern density of the conductive layer where the first and second drain-gate wiring layers are formed.

However, in accordance with the present embodiment, the first drain-gate wiring layer 30 is located in the first conductive layer. Also, the second drain-gate wiring layer has a structure that is divided into the lower layer 32a and the upper layer 32b. The lower layer 32a is located in the second conductive layer, and the upper layer 32b is located in the third conductive layer. Consequently, the first drain-gate wiring layer and the second drain-gate wiring layer are formed in different layers, respectively. Accordingly, since the first drain-gate wiring layer and the second drain-gate wiring layer are not formed in the same layer, the pattern density of the wiring layer can be reduced. As a result, with the memory cell in accordance with the present embodiment, the cell area can be reduced.

4. Example of Application of SRAM to Electronic Apparatus

Figure 16:
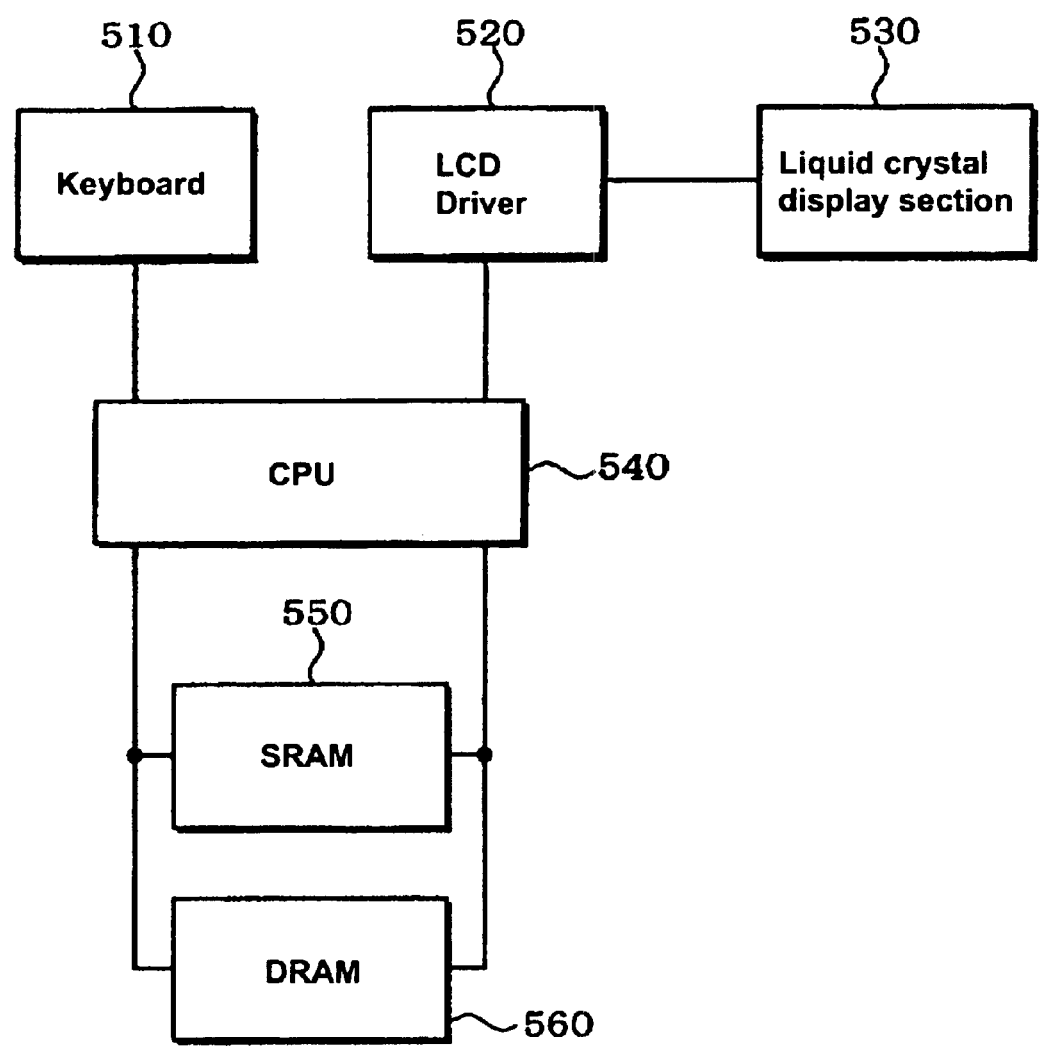
FIG. 16 shows a block diagram of a part of a mobile telephone system equipped with the SRAM in accordance with the present embodiment.

The SRAM in accordance with the present embodiment may be applied to electronic apparatus, such as, for example, mobile equipment. FIG. 16 shows a block diagram of a part of a mobile telephone system. A CPU 540, an SRAM 550 and a DRAM 560 are mutually connected via a bus line. Further, the CPU 540 is connected to a keyboard 510 and an LCD driver 520 via the bus line. The LCD driver 520 is connected to a liquid crystal display section 530 via the bus line. The CPU 540, the SRAM 550 and the DRAM 560 compose a memory system.

Figure 17:
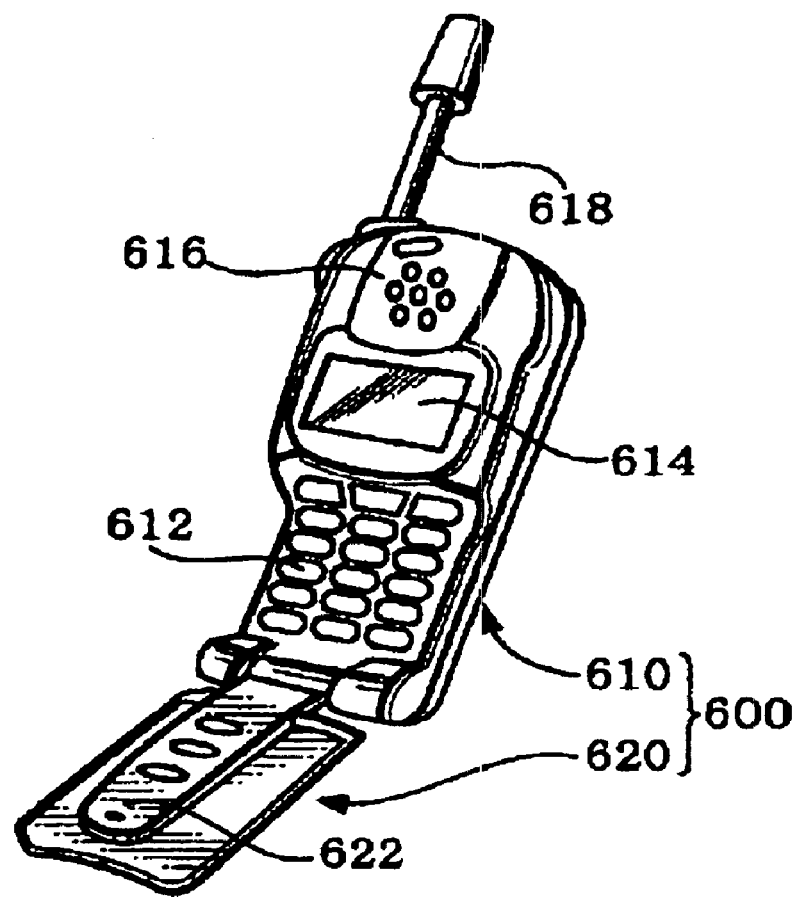
FIG. 17 shows a perspective view of a mobile telephone that is equipped with the mobile telephone system shown in FIG. 16.

FIG. 17 shows a perspective view of a mobile telephone 600 that is equipped with the mobile telephone system shown in FIG. 16. The mobile telephone 600 is equipped with a main body section 610 including a keyboard 612, a liquid crystal display section 614, a receiver section 616 and an antenna section 618, and a lid section 620 including a transmitter section 622.

5. Modification Examples

The following modifications, for example, may be made to the present embodiment described above.

Figure 18:
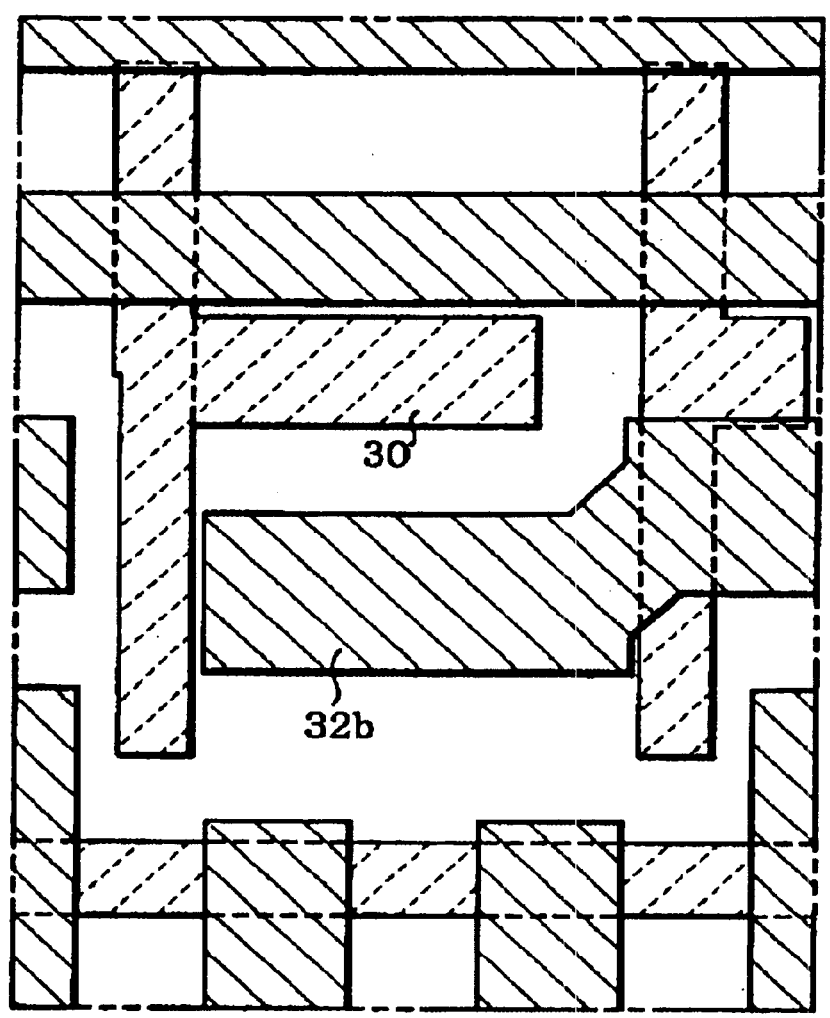
FIG. 18 schematically shows a plan view of the first conductive layer and the third conductive layer of the memory cell of the SRAM in accordance with a first modified embodiment example.

(1) The upper layer 32b may be provided such that it does not overlap the first gate-gate electrode layer 30 at all as viewed in a plan view, as shown in FIG. 18. By this, the capacitive coupling between the first drain-gate wiring layer 30 and the lower layer 32b can be suppressed. As a result, the influence of the potential on one node that may be inflicted upon the potential at the other node can be suppressed by a corresponding amount of which the capacitive coupling is suppressed.

Figure 19:
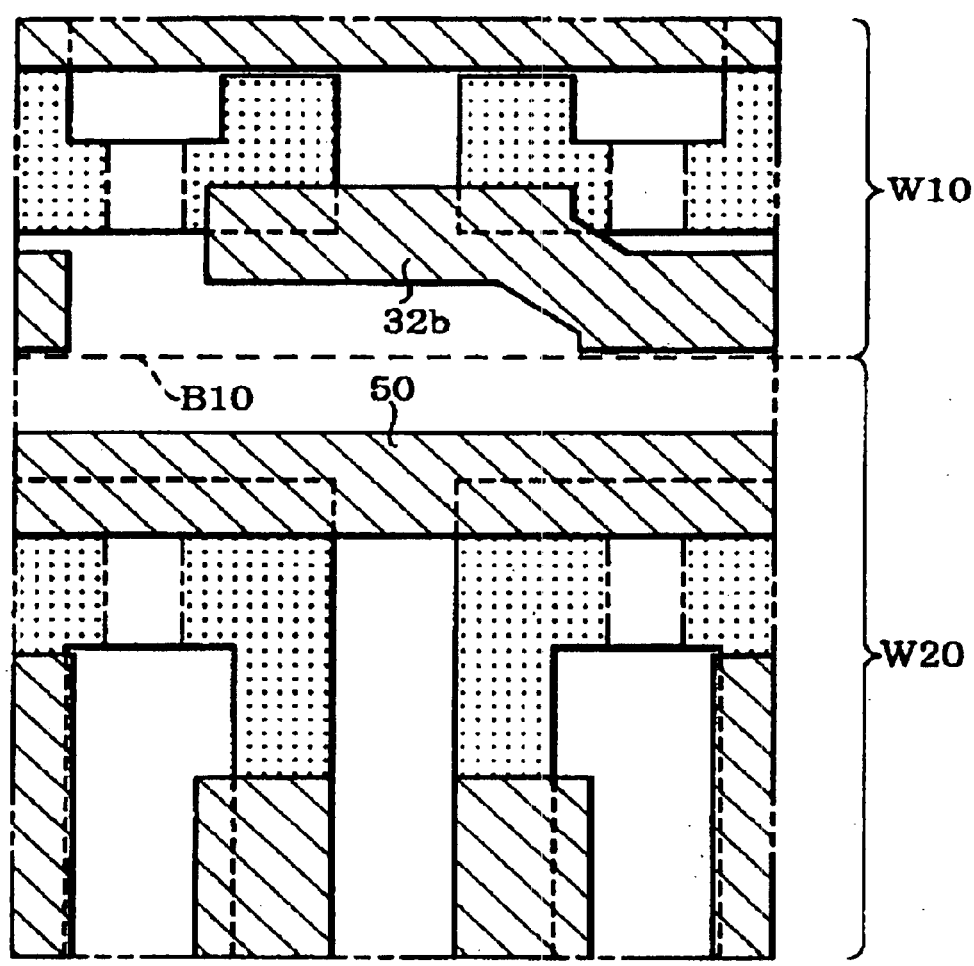
FIG. 19 schematically shows a plan view of the field and the third conductive layer of the memory cell of the SRAM in accordance with a second modified embodiment example.
Figure 20:
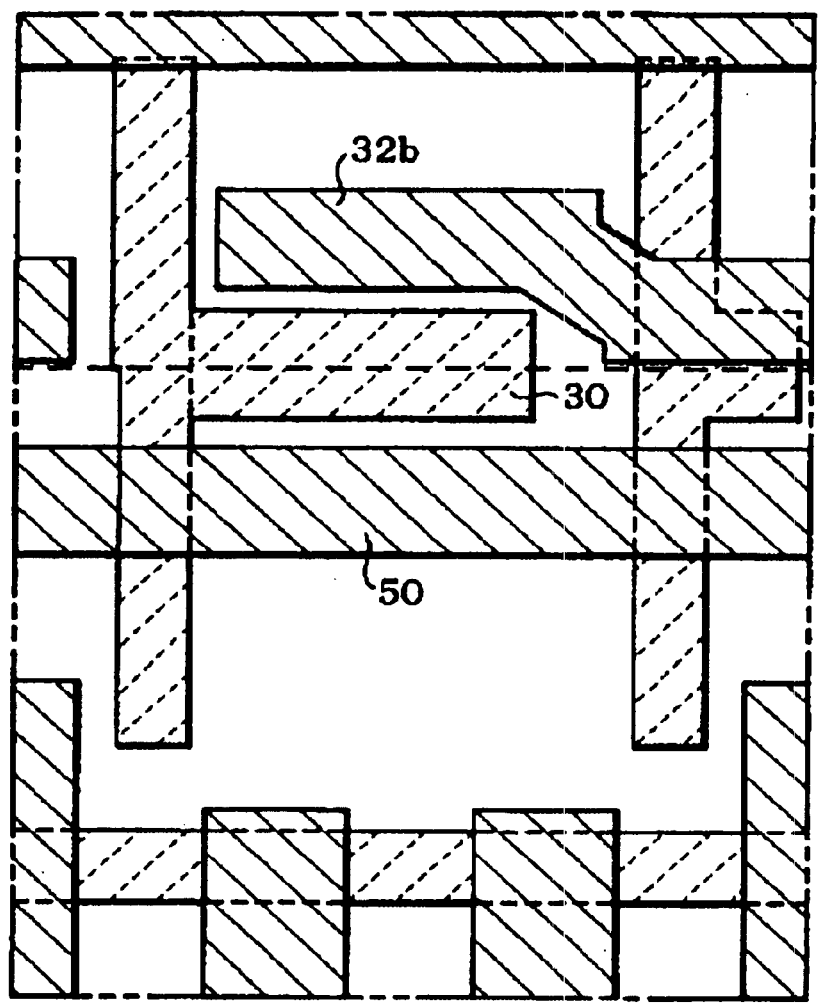
FIG. 20 schematically shows a plan view of the first conductive layer and the third conductive layer of the memory cell of the SRAM in accordance with a second modified embodiment example.
Figure 21:
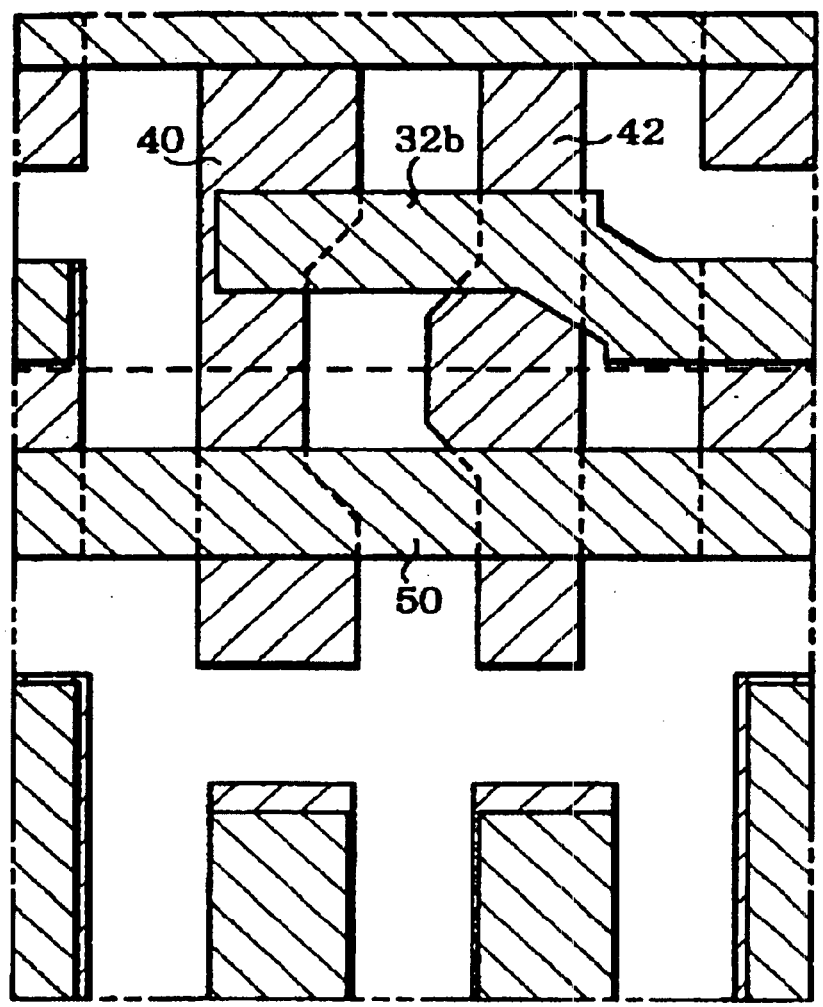
FIG. 21 schematically shows a plan view of the second conductive layer and the third conductive layer of the memory cell of the SRAM in accordance with a second modified embodiment example.

(2) The upper layer 32b may be provided on the n-type well region W10 side of the border B10 between the n-type well region W10 and the p-type well region W20, as shown in FIGS. 19–21. In this case, a gap between the Vss contact pad layer 74b and the contact pad layers 70b and 72b for bit lines and the upper layer 32b can be made wider. As a result, the main word line 50 can be readily formed in the gap (over the p-type well region W20) without being short-circuited with the upper layer 32b, the Vss contact pad layer and the contact pad layers for bit lines.

Also, in this case, the upper layer 32b and the first gate-gate electrode layer 30 may be provided in a manner not to overlap one another as viewed in a plan view, as shown in FIG. 20.

The present invention is not limited to the embodiment described above, and a variety of modifications can be made within the scope of the subject matter of the present invention.

What is claimed is:

1. A semiconductor device comprising:

a first conduction type well region;

a second conduction type well region;

a first gate-gate electrode layer including a gate electrode of a first load transistor and a gate electrode of a first driver transistor;

a second gate-gate electrode layer including a gate electrode of a second load transistor and a gate electrode of a second driver transistor;

a first drain-drain wiring layer that forms a part of a connection layer that electrically connects a drain region of the first load transistor and a drain region of the first driver transistor;

a second drain-drain wiring layer that forms a part of a connection layer that electrically connects a drain region of the second load transistor and a drain region of the second driver transistor;

a first drain-gate wiring layer that forms a part of a connection layer that electrically connects the first gate-gate electrode layer and the second drain-drain wiring layer; and a second drain-gate wiring layer that forms a part of a connection layer that electrically connects the second gate-gate electrode layer and the first drain-drain wiring layer, wherein the first load transistor and the second load transistor are provided in the first conduction type well region, wherein the first driver transistor and the second driver transistor are provided in the second conduction type well region, wherein the second drain-gate wiring layer is located in a layer over the first drain-gate wiring layer, and has an upper layer of the second drain-gate wiring layer and a lower layer of the second drain-gate wiring layer, wherein the upper layer is located in a layer over the lower layer, and wherein the upper layer is provided above one of the first conduction type well region and the second conduction type well region.

2. The semiconductor device according to claim 1,
wherein the upper layer is provided above the second conduction type well region without exceeding a border between the first conduction type well region and the second conduction type well region.

3. The semiconductor device according to claim 2, further comprising a main word line,
wherein the main word line is provided in the same layer as the upper layer, and is provided above the first conduction type well region without exceeding a border between the first conduction type well region and the second conduction type well region.

4. The semiconductor device according to claim 1,
wherein the upper layer is provided above the first conduction type well region without exceeding a border between the first conduction type well region and the second conduction type well region.

5. The semiconductor device according to claim 4, further comprising a main word line,
wherein the main word line is provided in the same layer as the upper layer, and is provided above the second conduction type well region without exceeding a border between the first conduction type well region and the second conduction type well region.

6. The semiconductor device according to claim 1,
wherein the first drain-gate wiring layer is electrically connected to the second drain-drain wiring layer through a contact section,
wherein the lower layer is electrically connected to the second gate-gate electrode layer through a contact section, and
wherein the upper layer is electrically connected to the first drain-drain wiring layer and the lower layer through contact sections, respectively.

7. The semiconductor device according to claim 1,
wherein the first gate-gate electrode layer, the second gate-gate electrode layer and the first drain-gate wiring layer are provided in the same layer, and
wherein the first drain-gate wiring layer is provided over a border between the first conduction type well region and the second conduction type well region.

8. The semiconductor device according to claim 1,
wherein the first drain-gate wiring layer and the upper layer are provided in a manner not to overlap one another as viewed from a vertical direction.

9. The semiconductor device according to claim 1,
wherein the first gate-gate electrode layer, the second gate-gate electrode layer and the first drain-gate wiring layer are located in a first conductive layer,
wherein the first drain-drain wiring layer, the second drain-drain wiring layer and the lower layer are located in a second conductive layer, and
wherein the upper layer is located in a third conductive layer.

10. The semiconductor device according to claim 1,
wherein a second conductive layer is a nitride layer of a refractory metal.

11. The semiconductor device according to claim 1,
wherein a second conductive layer has a thickness of 100 to 200 nm.

12. A memory system provided with the semiconductor device according to claim 1.

13. An electronic apparatus provided with the semiconductor device according to claim 1.

14. A semiconductor device comprising:
a first conduction type well region;
a second conduction type well region;
a first gate-gate electrode layer including a gate electrode of a first load transistor and a gate electrode of a first driver transistor;
a second gate-gate electrode layer including a gate electrode of a second load transistor and a gate electrode of a second driver transistor;
means for electrically connecting a drain region of the first load transistor and a drain region of the first driver transistor;
means for electrically connecting a drain region of the second load transistor and a drain region of the second driver transistor;
means for electrically connecting the first gate-gate electrode layer and a second drain-drain wiring layer; and
means for electrically connecting the second gate-gate electrode layer and a first drain-drain wiring layer,
wherein the first load transistor and the second load transistor are provided in the first conduction type well region,
wherein the first driver transistor and the second driver transistor are provided in the second conduction type well region,
wherein a second drain-gate wiring layer is located in a layer over a first drain-gate wiring layer, and has an upper layer of the second drain-gate wiring layer and a lower layer of the second drain-gate wiring layer,
wherein the upper layer is located in a layer over the lower layer, and
wherein the upper layer is provided above one of the first conduction type well region and the second conduction type well region.

15. The semiconductor device according to claim 14, wherein the upper layer is provided above the second conduction type well region without exceeding a border between the first conduction type well region and the second conduction type well region.

16. The semiconductor device according to claim 15, further comprising a main word line, wherein the main word line is provided in the same layer as the upper layer, and is provided above the first conduction type well region without exceeding a border between the first conduction type well region and the second conduction type well region.

17. The semiconductor device according to claim 14, wherein the upper layer is provided above the first conduction type well region without exceeding a border between the first conduction type well region and the second conduction type well region.

18. The semiconductor device according to claim 17 further comprising a main word line, wherein the main word line is provided in the same layer as the upper layer, and is provided above the second conduction type well region without exceeding a border between the first conduction type well region and the second conduction type well region.

19. The semiconductor device according to claim 14,
wherein the first drain-gate wiring layer is electrically connected to the second drain-drain wiring layer through a contact section,
wherein the lower layer is electrically connected to the second gate-gate electrode layer through a contact section, and wherein the upper layer is electrically connected to the first drain-drain wiring layer and the lower layer through contact sections, respectively.

20. The semiconductor device according to claim 14, wherein the first gate-gate electrode layer, the second gate-gate electrode layer and the first drain-gate wiring layer are provided in the same layer, and wherein the first drain-gate wiring layer is provided over a border between the first conduction type well region and the second conduction type well region.

21. The semiconductor device according to claim 14, wherein the first drain-gate wiring layer and the upper layer are provided in a manner not to overlap one another as viewed from a vertical direction.

22. The semiconductor device according to claim 14, wherein the first gate-gate electrode layer, the second gate-gate electrode layer and the first dram-gate wiring layer are located in a first conductive layer, wherein the first drain-drain wiring layer, the second drain-drain wiring layer and the lower layer are located in a second conductive layer, and wherein the upper layer is located in a third conductive layer.

23. The semiconductor device according to claim 14, wherein a second conductive layer is a nitride layer of a refractory metal.

24. The semiconductor device according to claim 14, wherein a second conductive layer has a thickness of 100 to 200 nm.

* * * * *